US008191505B2

(12) United States Patent
Kamaishi et al.

(10) Patent No.: US 8,191,505 B2
(45) Date of Patent: Jun. 5, 2012

(54) PROCESS GAS INTRODUCING MECHANISM AND PLASMA PROCESSING DEVICE

(75) Inventors: Takayuki Kamaishi, Nirasaki (JP); Akinori Shimamura, Nirasaki (JP); Masato Morishima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 288 days.

(21) Appl. No.: 12/457,834

(22) Filed: Jun. 23, 2009

(65) Prior Publication Data

US 2009/0260762 A1 Oct. 22, 2009

Related U.S. Application Data

(60) Division of application No. 11/264,309, filed on Nov. 2, 2005, now abandoned, which is a continuation of application No. PCT/JP2004/006165, filed on Apr. 28, 2004.

(30) Foreign Application Priority Data

May 2, 2003 (JP) ................................ 2003-127201
Jun. 25, 2003 (JP) ................................ 2003-180865

(51) Int. Cl.

| | |
|---|---|
| ***C23C 16/507*** | (2006.01) |
| ***C23C 16/503*** | (2006.01) |
| ***C23F 1/00*** | (2006.01) |
| ***H01L 21/306*** | (2006.01) |
| *C23C 16/06* | (2006.01) |
| *C23C 16/22* | (2006.01) |

(52) U.S. Cl. ................ 118/723 I; 118/723 IR; 118/715; 156/345.48; 156/345.52

(58) Field of Classification Search ................ 118/723 I, 118/723 IR, 715; 156/345.48, 345.52
See application file for complete search history.

(56) References Cited

U.S. PATENT DOCUMENTS

| | | | | |
|---|---|---|---|---|
| 5,777,289 | A | | 7/1998 | Hanawa et al. |
| 5,792,272 | A | * | 8/1998 | van Os et al. ............ 118/723 R |
| 5,937,323 | A | | 8/1999 | Orczyk et al. |
| 6,042,653 | A | * | 3/2000 | Tanaka et al. ................ 118/728 |
| 6,050,446 | A | | 4/2000 | Lei et al. |
| 6,095,083 | A | | 8/2000 | Rice et al. |
| 6,248,250 | B1 | | 6/2001 | Hanawa et al. |
| 6,270,617 | B1 | | 8/2001 | Yin et al. |

FOREIGN PATENT DOCUMENTS

| | | |
|---|---|---|
| JP | 11-008230 | 1/1999 |
| JP | 11-026190 | 1/1999 |
| JP | 11-135296 | 5/1999 |
| WO | WO 03/010809 | 2/2003 |

* cited by examiner

*Primary Examiner* — Rudy Zervigon
(74) *Attorney, Agent, or Firm* — Oblon, Spivak, McClelland, Maier & Neustadt, L.L.P.

(57) ABSTRACT

A processing gas introducing mechanism for introducing a processing gas into a processing space is provided between a plasma generation unit and a chamber of a plasma processing apparatus. The processing gas introducing mechanism includes a gas introducing base having therein a gas introducing path for introducing the processing gas into the processing space, and a near ring-shaped gas introducing plate equipped in the hole part of the gas introducing base such that it can be detached therefrom. Herein, the gas introducing base has a hole part forming one portion of the processing space in a central portion thereof, and the gas introducing plate has plural gas discharge holes communicating with the processing space to discharge thereinto the processing gas from the gas introducing path.

22 Claims, 15 Drawing Sheets

PROCESS GAS INTRODUCING MECHANISM AND PLASMA PROCESSING DEVICE

This application is a Divisional Application of pending U.S. application Ser. No. 11/264,309 filed Nov. 2, 2005, which is herein incorporated by reference, which is the National Stage application of PCT International Application No. PCT/JP04/006165 filed on Apr. 28, 2004, which designated the United States and claims priority to Japanese Application Nos. 2003-127201, filed May 2, 2003 and 2003-180865, filed Jun. 25, 2003.

FIELD OF THE INVENTION

The present invention relates to a processing gas introducing mechanism for introducing a processing gas for use in a substrate processing, and a plasma processing apparatus for performing a plasma processing on a substrate by introducing a processing gas.

BACKGROUND OF THE INVENTION

In a semiconductor manufacturing processing, e.g., a Ti film is formed on a bottom portion of a contact hole formed in a silicon wafer as an object to be processed; a TiSi is formed by an interdiffusion between Ti and Si of a substrate; a barrier layer such as a TiN or the like is formed on the TiSi; an Al layer, a W layer, a Cu layer and the like are formed on the barrier layer; and thus, holes are filled and wirings are fabricated. Conventionally, for performing a series of processings as described above, there has been employed a metal film forming system of, e.g., a cluster tool type having plural chambers. In such a metal film forming system, there is performed, prior to a film forming processing, a processing for removing a native oxide film, an etching damage layer and the like, which are formed on the silicon wafer, in order to obtain a fine contact. As for a device removing such a native oxide film, it has been known that an inductively coupled plasma is formed by using a hydrogen gas and an argon gas (Japanese Patent Laid-open Application No. H04-336426).

Further, as for a device performing a processing by forming an inductively coupled plasma, such a configuration has been known that a bell jar made of a dielectric material is provided at an upper portion of a chamber in which a semiconductor wafer as an object to be processed is disposed; and a coil inductor connected to an RF power supply is wound in an outer periphery of the bell jar to generate an inductively coupled plasma (Japanese Patent Laid-open Application No. H10-258227, H10-116826, H11-67746 and 2002-237486).

This kind of inductively coupled plasma processing apparatus, a portion of which is shown in FIG. 1, can be configured such that a plasma generation unit 400 including a bell jar 401, a coil 403, an RF power supply (not shown) and the like, is fixed to a chamber 201 accommodating therein an object to be processed by using a screw through a gas introducing ring 408 for introducing a processing gas.

To be specific, the bell jar 401 is fixed at the gas introducing ring 408 by using a screw component 410 by a bell jar clamping element 409. At this time, between the bell jar clamping element 409, the gas introducing ring 408 and the bell jar 401, there is inserted an annular buffer 409*a* made of a resin such as PTFE (polytetrafluoroethylene) or the like, to protect the bell jar 401.

The gas introducing ring 408 supporting the bell jar 401 is configured to be supported by a lid base 407, wherein the lid base 407 is mounted on the chamber 201.

Seal members 413 and 414 such as, e.g., O-ring or the like, are inserted into spaces formed between the bell jar 401 and the gas introducing ring 408, and between the lid base 407 and the chamber 201, to keep an airtightness therebetween.

For example, a processing gas such as an Ar gas, an $H_2$ gas or the like is configured to be introduced into a processing space 402 from a gas channel 408*b* and a gas hole 408*a* communicating with the gas channel 408*b*. The processing gas introduced as mentioned above is plasma-excited to perform a plasma processing on a semiconductor wafer as a substrate to be processed.

In this case, scattered materials due to the plasma processing, e.g., a sputter etching, are adhered to a side of the gas introducing ring 408 or the lid base 407 to thereby become deposits. If the deposits are getting thicker, they are peeled off from a place where they have been adhered, to thereby become foreign materials. As a result, such problems as lowering in an operation rate of the device, lowering in a production yield of a semiconductor device and the like, are incurred.

For this reason, a cover shield 411 is configured to be attached by using a screw 412, to cover the gas introducing ring 408 and the lid base 407 inside the processing space 402. In case where the scattered materials due to the etching are adhered to the cover shield 411, the cover shield 411 is replaced by unscrewing and then tightly screwing back the screw 412, to thereby prevent foreign materials from being produced due to accumulation of deposits.

Further, a hole portion 411*a* having a diameter larger than that of a gas hole 408*a* is provided in the cover shield 411 in order not to block a diffusion of the processing gas introduced from the gas hole 408*a*. Accordingly, the deposits are likely to be adhered to the vicinity of the gas hole 408*a* of the gas introducing ring 408. Thus, the gas introducing ring 408 as well as the cover shield 411 needs to be replaced when performing a maintenance.

However, when replacing the cover shield 411, the bell jar 401, the gas introducing ring 408 and the lid base 407 need to be detached, thereby increasing the time for maintenance, which becomes problematic. Further, the gas introducing ring 408 has a complicated configuration wherein the gas channel 408*b* and the like are formed, and cost of a component to be replaced is expensive, thereby increasing the running-cost of the device and lowering a productivity of the semiconductor device.

Meanwhile, in such an inductively coupled plasma processing apparatus, a shape of the processing space applied for the plasma processing has not been studied in detail and the uniformity in the plasma processing is not necessarily satisfactory.

Further, as for a configuration of a susceptor mounting thereon a wafer inside a vessel, in which a plasma is generated, it has been widely known that an area for supporting the wafer is cut to have a recess portion to perform a positioning of the wafer (Japanese Patent Laid-open Application No. 2002-151412).

However, even in case of adopting such a configuration of the susceptor, the uniformity in the plasma processing is not satisfactory.

SUMMARY OF THE INVENTION

It is, therefore, a primary object of the present invention to provide a processing gas introducing mechanism and a plasma processing apparatus capable of reducing running-cost by cutting cost of components to be replaced when performing a maintenance.

It is another object of the present invention to provide a plasma processing apparatus capable of easily performing a maintenance and reducing the time therefor.

It is still another object of the present invention to provide a plasma processing apparatus capable of improving the in-surface uniformity of an object to be processed in a plasma processing by using an inductively coupled plasma.

It is still another object of the present invention to provide a plasma processing apparatus capable of improving the in-surface uniformity of an object to be processed, without increasing cost for design or fabrication, and without losing the universality of a configuration of a device.

In accordance with the first aspect of the present invention, there is provided a processing gas introducing mechanism, provided between a plasma generation unit and a chamber accommodating therein a substrate to be processed of a plasma processing apparatus, for introducing a processing gas into a processing space formed by the plasma generation unit and the chamber, including: a gas introducing base disposed on the chamber to support the plasma generation unit, the gas introducing base having therein a gas introducing path for introducing the processing gas into the processing space, and, in a central portion thereof, a hole part forming one portion of the processing space; and a near ring-shaped gas introducing plate equipped in the hole part of the gas introducing base such that it can be detached therefrom, the gas introducing plate having plural gas discharge holes communicating with the processing space to discharge thereinto the processing gas from the gas introducing path.

In accordance with the second aspect of the present invention, there is provided a plasma processing apparatus, including: a plasma generation unit for producing a plasma; a chamber accommodating therein a substrate to be processed; and a processing gas introducing mechanism, provided between the plasma generation unit and the chamber, for introducing a processing gas for producing a plasma into a processing space formed by the plasma generation unit and the chamber, wherein the processing gas introducing mechanism contains: a gas introducing base disposed on the chamber to support the plasma generation unit, the gas introducing base having therein a gas introducing path for introducing the processing gas into the processing space, and, in a central portion thereof, a hole part forming one portion of the processing space; and a near ring-shaped gas introducing plate equipped in the hole part of the gas introducing base such that it can be detached therefrom, the gas introducing plate having plural gas discharge holes communicating with the processing space to discharge thereinto the processing gas from the gas introducing path.

In accordance with the third aspect of the present invention, there is provided a plasma processing apparatus, including: a plasma generation unit for producing a plasma; a chamber accommodating therein a substrate to be processed; a processing gas introducing mechanism, provided between the plasma generation unit and the chamber and disposed in the chamber to support the plasma generation unit, for introducing a processing gas for producing a plasma into a processing space formed by the plasma generation unit and the chamber; and an attaching and detaching mechanism for attaching the processing gas introducing mechanism and the plasma generation unit to the chamber and detaching them therefrom.

In accordance with the first and the second aspect of the present invention, the gas introducing base is configured to be disposed on the chamber to support the plasma generation unit, to have therein the gas introducing path for introducing the processing gas into the processing space, and, in a central portion thereof, and to have the hole part forming one portion of the processing space; and the near ring-shaped gas introducing plate having plural gas discharge holes communicating with the processing space to discharge thereinto the processing gas from the gas introducing path is equipped in the hole part of the gas introducing base such that it can be detached therefrom. Thus, the configuration of the processing gas introducing mechanism becomes simplified, and consumables thereof may be replaced easily. Accordingly, the time for maintenance may be shortened, and an operating rate of the plasma processing apparatus is increased to thereby improve the productivity thereof. Further, since the configuration of the processing gas introducing mechanism becomes simplified, the production cost thereof may be reduced, and thus, cost reduction in the configuration of the plasma processing apparatus may be achieved.

In accordance with the third aspect of the present invention, the attaching and detaching mechanism for attaching the processing gas introducing mechanism and the plasma generation unit to the chamber and detaching them therefrom is installed, so that the maintenance may be readily performed and the time therefor may be shortened.

In accordance with the fourth aspect of the present invention, there is provided a plasma processing apparatus for performing a plasma processing on a substrate to be processed, the apparatus including: a chamber accommodating therein the substrate to be processed; a plasma generation unit, having a bell jar and an antenna, for producing a plasma inside the bell jar, wherein the bell jar made of a dielectric material is provided at an upper part of the chamber to communicate therewith and the antenna is coiled around an outer side of the bell jar to generate an induced electric field in the bell jar; a processing gas introducing mechanism, provided between the plasma generation unit and the chamber, for introducing a processing gas for producing a plasma into a processing space formed by the plasma generation unit and the chamber; and a mounting table for mounting thereon the substrate to be processed provided in the chamber, wherein, given that an inner diameter of the bell jar is D and an inside measurement of height in a central portion of the bell jar is H, a flatness K defined by a ratio D/H is in the range of 1.60~9.25.

In accordance with the fifth aspect of the present invention, there is provided a plasma processing apparatus for performing a plasma processing on a substrate to be processed, the apparatus including: a chamber accommodating therein the substrate to be processed; a plasma generation unit, having a bell jar and an antenna, for producing a plasma inside the bell jar, wherein the bell jar made of a dielectric material is provided at an upper part of the chamber to communicate therewith and the antenna is coiled around an outer side of the bell jar to generate an induced electric field in the bell jar; a processing gas introducing mechanism, provided between the plasma generation unit and the chamber, for introducing a processing gas for producing a plasma into a processing space formed by the plasma generation unit and the chamber; and a mounting table for mounting thereon the substrate to be processed provided in the chamber, wherein, given that an inner diameter of the bell jar is D and a distance from a ceiling portion of a central portion of the bell jar to the mounting table is H1, a flatness K1 defined by a ratio D/H1 is in the range of 0.90~3.85.

The fourth and the fifth aspect of the present invention are based on the knowledge found by the present inventors that the height of the bell jar has a significant impact on a variation in the density distribution of the plasma for the substrate to be processed in the processing apparatus using the inductively coupled plasma as mentioned above, and it is effective to optimize the height of the bell jar to improve the in-surface uniformity in the plasma processing as described above on the silicon wafer of the large diameter, particularly.

In accordance with the fourth aspect of the present invention, since the flatness K of the bell jar in which a plasma is produced is set large in the range of 1.60~9.25, the plasma produced in the bell jar above the substrate to be processed disposed on the mounting table gets wider towards a process surface of the substrate to be processed, and thus, the density distribution of the plasma becomes uniform along the process surface. Accordingly, the in-surface uniformity of the substrate to be processed in the plasma processing is improved.

In accordance with the fifth aspect of the present invention, since the flatness K1 of the bell jar, taking the distance from the mounting table to the ceiling portion of the bell jar into consideration, is set large in the range of 0.90~3.85, the plasma produced in the bell jar above the substrate to be processed disposed on the mounting table gets wider towards a process surface of the substrate to be processed, and thus, the density distribution of the plasma becomes uniform along the process surface. Accordingly, the in-surface uniformity of the substrate to be processed in the plasma processing is improved.

Further, in the fourth and the fifth aspect, the bell jar is made flatter while employing the configurations of the conventional art for other chamber parts, so that it is possible to improve the in-surface uniformity of the substrate to be processed during the plasma processing without bring about running-cost increase due to modification of design for the chamber part or the like, or lowering of the universality, which is caused by modification of external connecting configuration of the chamber part or the like.

In accordance with the sixth aspect of the present invention, there is provided a plasma processing apparatus for performing a plasma processing on a substrate to be processed, the apparatus including: a chamber accommodating therein the substrate to be processed; a plasma generation unit, having a bell jar and an antenna, for producing a plasma inside the bell jar, wherein the bell jar made of a dielectric material is provided at an upper part of the chamber to communicate therewith and the antenna is coiled around an outer side of the bell jar to generate an induced electric field in the bell jar; a processing gas introducing mechanism, provided between the plasma generation unit and the chamber, for introducing a processing gas for producing a plasma into a processing space formed by the plasma generation unit and the chamber; a mounting table for mounting thereon the substrate to be processed provided in the chamber; and a mask, made of a dielectric material, for covering the mounting table and mounting thereon the substrate to be processed, and wherein the mask has a first region where the substrate to be processed is mounted and a second region around the first region, and the first and the second region are configured to have a same height.

The sixth aspect of the present invention is to resolve such a problem that, in the conventional susceptor, an area for supporting the wafer is cut to have a recess portion and an impedance in the outer periphery of the recess portion gets larger than that of the central portion thereof, so that a bias for producing a plasma and the like may be affected, and thus, lowering the in-surface uniformity in the plasma processing. Further, in the mask of the mounting table where the substrate to be processed is mounted, since the first region where the substrate to be processed is mounted and the second region around the first region are configured to have a same height, impedances in the first and the second region are uniform during the plasma generation, and density distributions of the plasma in the peripheral and the central portions of the substrate to be processed are uniform, to thereby improve the in-surface uniformity of the substrate to be processed during the plasma processing.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENT

Preferred embodiments of the present invention will be described with reference to the accompanying drawings.

(First Embodiment)

Figure 1:
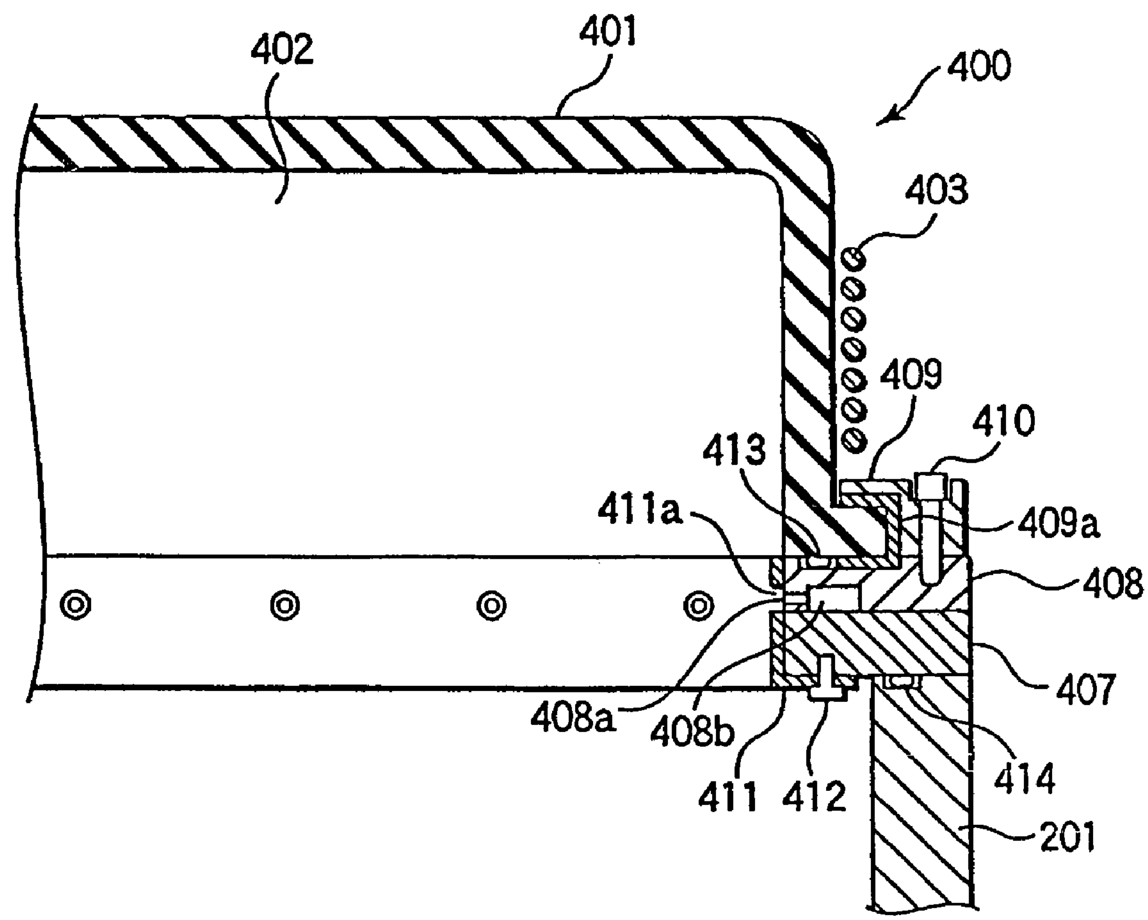
FIG. 1 offers a view schematically showing a magnified portion of a conventional plasma processing apparatus.
Figure 2:
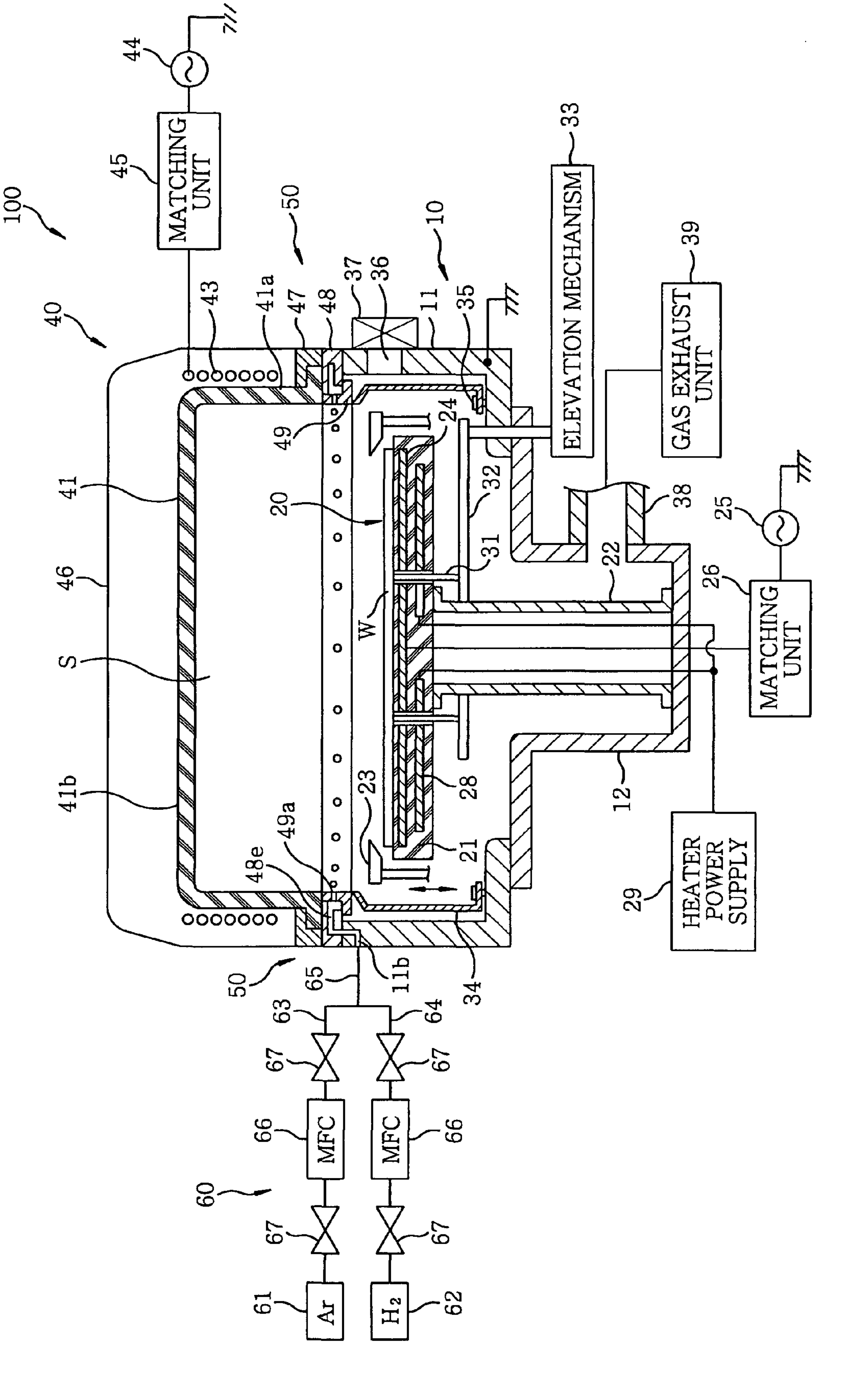
FIG. 2 shows a cross sectional view schematically showing a plasma processing apparatus in accordance with a first embodiment of the present invention.

FIG. 2 is a schematic configuration of a plasma processing apparatus in accordance with a first embodiment of the present invention. A plasma processing apparatus 100 for performing a plasma processing on a substrate to be processed is employed, e.g., in a processing for plasma-etching to remove an impurity layer containing an oxide film such as a native oxide or the like, which is formed on a metal film or a silicon formed on the substrate to be processed.

The plasma processing apparatus 100 includes a chamber 10 accommodating therein a semiconductor wafer as a substrate to be processed; a wafer supporting portion 20 supporting the semiconductor wafer in the chamber 10; a plasma generation unit 40, installed to cover the chamber 10, for generating a plasma in a processing space S where a plasma processing is performed on the wafer; a gas introducing mechanism 50 for introducing a gas for producing a plasma into the processing space S; and a gas supply unit 60 for supplying a gas for producing a plasma into the gas introducing mechanism 50. Further, though not shown in FIG. 2, there is also included an attaching and detaching mechanism, as explained below, for attaching and detaching the gas introducing mechanism 50 and the plasma generation unit 40.

The chamber 10 made of a metal material, such as aluminum, aluminum alloy or the like, has a cylindrical main body 11; and an exhaust chamber 12 provided at a lower part of the main body 11 and having a diameter smaller than that of the main body 11. The exhaust chamber 12 is installed to uniformly exhaust an inside of the main body 11.

At an upper part of the chamber 10, there is installed a bell jar 41 as a constituent of the plasma generation unit 40 in such a way that it is connected to the chamber 10 to be able to communicate therewith. The bell jar 41 made of a dielectric material is of a cylindrical shape, e.g., a domed shape, whose upper portion is closed. Further, a processing vessel is formed by the chamber 10 and the bell jar 41, and an inside thereof corresponds to the processing space S.

The wafer supporting portion 20 has a susceptor (mounting table) 21, made of a dielectric material, for horizontally supporting the semiconductor wafer W as an object to be processed, wherein the susceptor 21 is disposed to be supported by a cylindrical supporting member 22 made of a dielectric material. Further, it can be configured such that a recess portion having a substantially same shape as that of the wafer W is formed at a top surface of the susceptor 21 to accommodate therein the wafer W, or an electrostatic adsorption mechanism may be provided at the top surface of the susceptor 21 to allow the wafer W to be adsorbed. As for the dielectric material forming the susceptor 21, ceramic materials, e.g., AlN and $Al_2O_3$, may be enumerated, and, among these, AlN of a high thermal conductivity is preferably used.

At an outer periphery of the susceptor 21, there is installed a vertically movable shadow ring 23 to cover an edge of the wafer W mounted on the susceptor 21. The shadow ring 23 focuses a plasma to facilitate to make it uniform. Further, it functions to protect the susceptor 21 from the plasma.

A mesh-shaped electrode 24 made of a metal, such as Mo, W or the like, is horizontally buried into the susceptor 21 at the upper portion thereof. To the electrode 24, there is connected a high frequency power supply 25 for attracting ions by applying a high frequency bias to the wafer, through a matching unit 26.

Further, a heater 28 is buried into the susceptor 21 to be disposed below the electrode 24 and can heat the wafer W to keep it at a predetermined temperature by feeding a power to the heater 28 from a heater source 29. Still further, feeder lines extending to the electrode 24 and the heater 28 are inserted into the supporting member 22.

Three wafer elevating pins 31 (only two of them are shown) for supporting and lifting up and down the wafer W are inserted into the susceptor 21; and they are installed such that they can be popped out from or popped into the top surface of the susceptor 21. These wafer elevating pins 31 are fixed at a supporting plate 32 and elevated through the supporting plate 32 by using an elevation mechanism 33 such as an air cylinder or the like.

Inside the main body 11 of the chamber 10, there is installed attachably and detachably a near cylindrical chamber shield 34 for preventing by-products and the like, which are produced during the plasma etching, from being adhered to an inner wall of the main body 11 along therewith. The chamber shield 34 is made of a Ti material (Ti or Ti alloy). As for a shield material, an Al material may be used, but particles may be generated during the processing in case of using it. Therefore, a Ti material is preferably used, since it has a high adhesivity to deposits and is able to significantly reduce generation of particles. Further, a shield main body of the Al material coated with Ti may be used. Still further, in a surface of the chamber shield 34, there may be formed fine prominences and depressions by using a blast processing or the like to improve the adhesivity to the deposits. The chamber shield 34 is fixed at a bottom wall of the main body 11 of the chamber 10 by using bolts 35 in some places (two places in the drawing); and it is detached from the main body 11 of the chamber 10 by pulling out the bolts 35. Accordingly, a maintenance of the chamber 10 may be readily performed.

At a sidewall of the chamber 10, there is formed an opening 36, which is opened or closed by using a gate valve 37. While the gate valve 37 is opened, the semiconductor wafer W is transferred between a neighboring load-lock chamber (not shown) and the chamber 10.

The exhaust chamber 12 of the chamber 10 is provided to be downwardly protruded to cover a circular hole formed in the center of the bottom wall of the main body 11. A gas exhaust line 38 is connected to a side of the exhaust chamber 12, and a gas exhaust unit 39 is connected thereto. Further, by operating the gas exhaust unit 39, insides of the chamber 10 and the bell jar 41 can be uniformly depressurized to a predetermined vacuum level.

The plasma generation unit 40 has the aforementioned bell jar 41; a coil 43 as an antenna unit, which is wound in an outer side of the bell jar 41; a high frequency power supply 44 supplying a high frequency power to the coil 43; and a shield vessel 46 covering the bell jar 41 and the coil 43 to shield ultraviolet and electromagnetic waves of plasma.

The bell jar 41 made of a dielectric material such as ceramic material, e.g., quartz, AlN or the like, has a cylindrical sidewall portion 41*a* and a domed ceiling wall portion 41*b* disposed thereon. The coil 43 is wound by the predetermined number of windings in a substantially horizontal direction in the outer side of the side wall portion 41*a* forming a cylinder of the bell jar 41, with 5~10 mm pitch between coils, and preferably, 8 mm pitch. The coil 43 is supported and fixed by using an insulating material, e.g., a fluorine resin or the like. In the drawing, the number of windings of the coil 43 is seven times.

The high frequency power supply 44 is connected to the coil 43 through a matching unit 45.

The high frequency power supply 44 generates a high frequency power of a frequency, e.g., 300 kHz~60 MHz, and preferably, 450 kHz~13.56 MHz. By supplying a high frequency power to the coil 43 from the high frequency power supply 44, an inductive electromagnetic field is generated in the processing space S inside the bell jar 41 through the side wall portion 41*a* thereof, which is made of a dielectric material.

The gas introducing mechanism 50 is provided between the chamber 10 and the bell jar 41, for supporting the bell jar 41, and includes a gas introducing base 48 mounted on the chamber 10; a gas introducing plate 49 equipped inside the gas introducing base 48; and a bell jar clamping element 47 for fixing the bell jar 41 to the gas introducing base 48. Further, it is configured such that a processing gas from the gas supply mechanism 60 is to be discharged to the processing space S through a gas introducing path 48*e* formed in the gas introducing base 48 and gas discharge openings 49*a* formed in the gas introducing plate 49 that will be explained later.

The gas supply mechanism 60 has an Ar gas supply source 61 and an $H_2$ gas supply source 62, to which gas lines 63 and 64 are connected, respectively, wherein the gas lines 63 and 64 are connected to a gas line 65. Further, the gases are guided to the gas introducing mechanism 50 through the gas line 65. In the gas lines 63 and 64, there are installed mass flow controllers 66, and opening/closing valves 67 having therebetween the mass flow controllers 66.

The Ar gas and the $H_2$ gas as a processing gas, which have been supplied to the gas introducing mechanism 50 through the gas line 65 of the gas supply mechanism 60, as mentioned above, are discharged to the processing space S through the gas introducing path 48*e* of the gas introducing mechanism 50 and the gas discharge holes 49*a* formed in the gas introducing plate 49; and they turn into a plasma by the inductive electromagnetic field generated in the processing space S as described above, to thereby form an inductively coupled plasma.

In the following, a configuration of the gas introducing mechanism 50 will be explained in detail.

Figure 3:
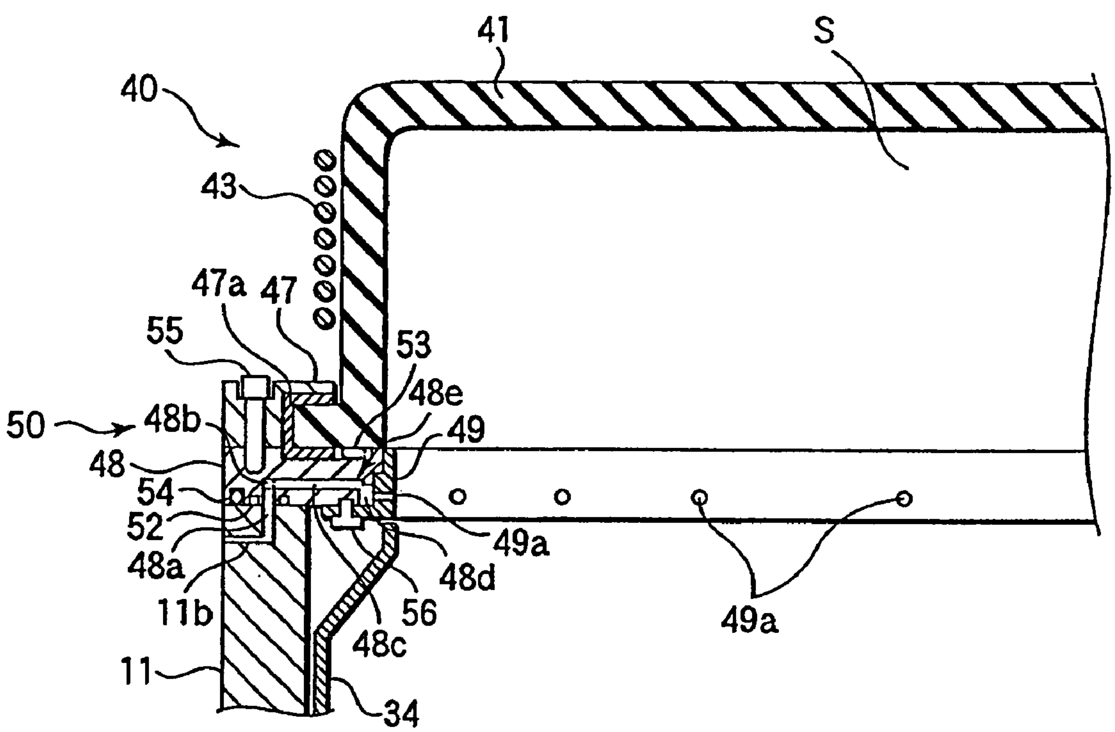
FIG. 3 explains a cross sectional view showing a magnified gas introducing mechanism of the plasma processing apparatus in accordance with the first embodiment of the present invention.

As in a magnified view shown in FIG. 3, at the gas introducing base 48, there is formed a first gas flow path 48*a* coupled to a gas introducing path 11*b* formed at a wall portion of the main body 11 of the chamber 10, wherein the first gas flow path 48*a* is coupled to a second gas flow path 48*b* formed in a substantially annular or semicircular shape inside the gas introducing base 48. Further, plural third gas flow paths 48*c* are formed equi-spacedly or diagonally toward the inner side from the second gas flow path 48*b*. Meanwhile, a near annular fourth gas flow path 48*d* is formed between the gas introducing base 48 and the gas introducing plate 49 such that the gas can be diffused uniformly, and the third gas flow paths 48*c* are connected thereto. Further, these first through fourth gas flow paths 48*a*, 48*b*, 48*c* and 48*d* are configured to communicate with each other to form a gas introducing path 48*e*.

The processing gas introduced from the gas line 65 is diffused uniformly in the second gas flow path 48*b* formed in a substantially annular or semicircular shape from the first gas flow path 48*a* formed at the gas introducing base 48, through the gas introducing path 11*b*. Further, the processing gas reaches the fourth gas flow path 48*d* of a substantially annular shape through the plural third gas flow paths 48*c*, which communicate with the second gas flow path 48*b* to be extended towards the processing space S.

Meanwhile, as mentioned above, in the gas introducing plate 49, there are equi-spacedly formed a number of gas discharge holes 49*a* communicating with the fourth gas flow path 48*d* and the processing space S; and the processing gas is discharged to the processing space S through the gas discharge holes 49*a* from the fourth gas flow path 48*d*. Further, in the vicinity of a connection part of the gas introducing path 11*b* and the first gas flow path 48*a*, there are installed seal rings 52 to keep an airtightness of a path, through which the processing gas is supplied.

Further, the gas introducing base 48 is configured to be mounted on the main body 11 of the chamber 10 while supporting the bell jar 41, as described above. At this time, between the gas introducing base 48 and the bell jar 41, and between the gas introducing base 48 and the main body 11 of the chamber 10, there are intervened respective seal members 53 and 54, e.g., O-ring or the like, to keep an airtightness of the processing space S.

The bell jar 41 is supported by the gas introducing base 48, and an end portion thereof is fixed thereto by using the bell jar clamping element 47. Further, the bell jar clamping element 47 is clamped by using a screw 55 on the gas introducing base 48. Between the bell jar clamping element 47 and the gas introducing base 48 and the bell jar 41, there is intervened with a buffer 47*a* made of PTFE or the like. It is intended to prevent the bell jar 41 made of a dielectric material, e.g., quartz, $Al_2O_3$, AlN or the like, from being damaged due to collision with the bell jar clamping element 47 or the gas introducing base 48 made of a metal material, e.g., Al or the like. Further, the gas introducing base 48 and the gas introducing plate 49 are clamped with each other by using screws 56.

In the following, the gas introducing base 48 and the gas introducing plate 49 forming the aforementioned processing gas introducing mechanism 50 will be discussed in detail.

Figure 4A:
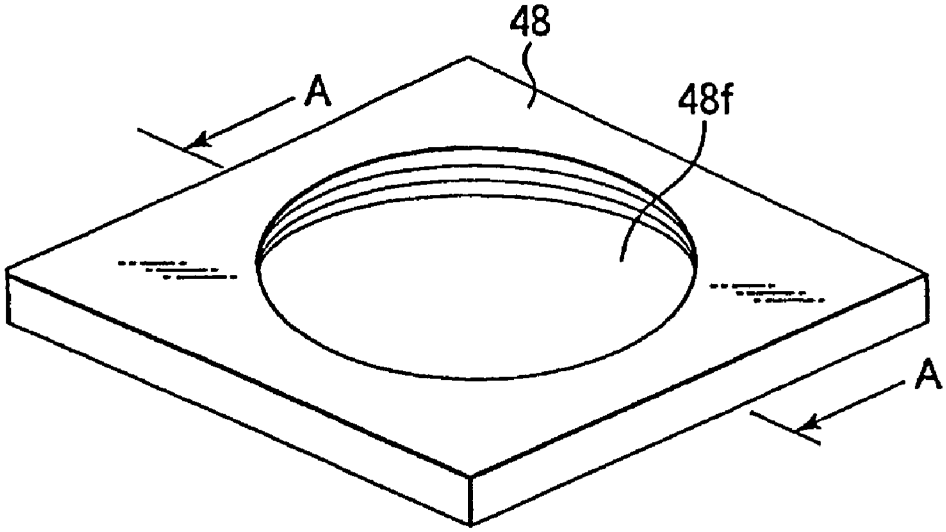
FIG. 4A sets forth a perspective view showing a gas introducing base forming the gas introducing mechanism.
Figure 4B:
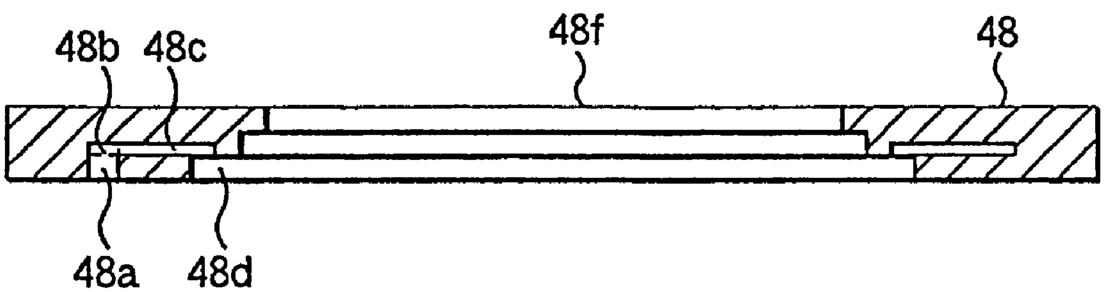
FIG. 4B presents a cross sectional view showing the gas introducing base.

FIGS. 4A and 4B present the gas introducing base 48: wherein FIG. 4A is a perspective view thereof; and FIG. 4B is a cross sectional view taken along A-A line of FIG. 4A. The gas introducing base 48 made of a metal material, e.g., Al or the like, is configured to have a substantially circular hole 48*f* in the center thereof, as shown in FIG. 4A, wherein the hole 48*f* forms one portion of the processing space S when the gas introducing base 48 is attached to the plasma processing apparatus 100. In the gas introducing base 48, as shown in the cross section of FIG. 4B, there are formed the above-described first through third gas flow paths 48*a*, 48*b* and 48*c*; and the third gas flow paths 48*c* communicate with a space 48*d'*. In an inner peripheral surface of the gas introducing base 48, there is formed a step portion, which matches that of the gas introducing plate 49. Further, when the gas introducing plate 49 is attached to the gas introducing base 48, a fourth gas flow path 48*d* is formed in a part corresponding to the space 48*d'*.

Figure 5A:
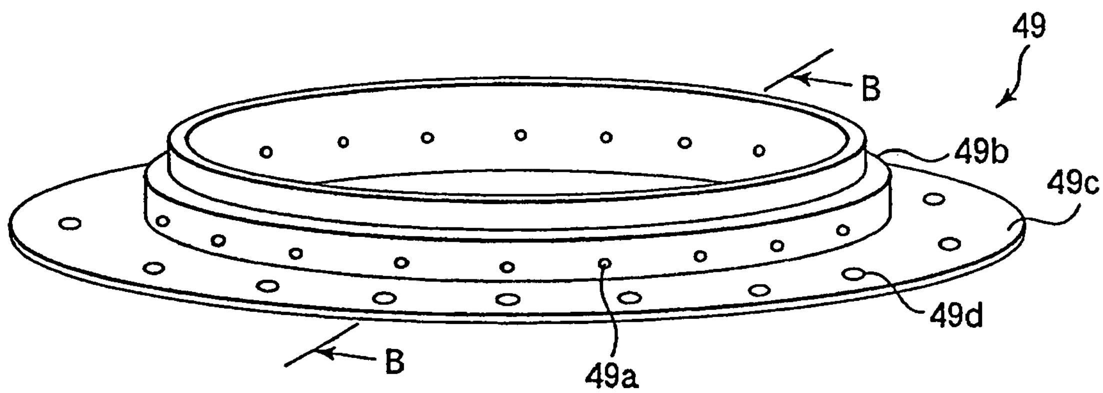
FIG. 5A provides a perspective view showing a gas introducing plate forming the gas introducing mechanism.
Figure 5B:
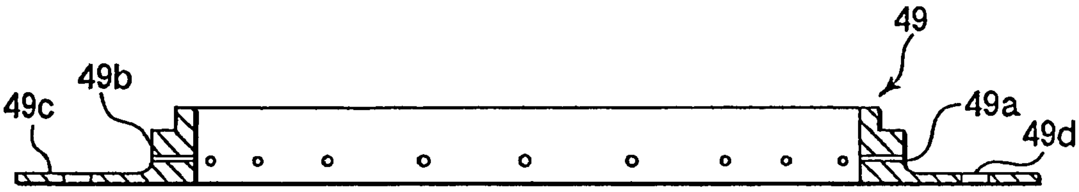
FIG. 5B describes a cross sectional view showing the gas introducing plate.

FIGS. 5A and 5B present the gas introducing plate 49: wherein FIG. 5A is a perspective view thereof; and FIG. 5B is a cross sectional view taken along B-B line of FIG. 5A. The gas introducing plate 49 of a substantially circular shape is made of a metal material, e.g., Ti, Al or the like, or a coated material wherein an Al basic material is coated with Ti by using a spraying or the like. The gas introducing plate 49 has a cylindrical main body 49*b* having a step portion, and a flange part 49*c* formed at an outer peripheral portion of a bottom portion thereof; and a number of gas discharge holes 49*a* are provided along a circumferential surface of the main body 49*b*. Further, in the flange part 49*c*, there are formed plural fixing holes, into which the aforementioned screws 56 are inserted to fix the flange part 49*c* to the gas introducing base 48.

Figure 6:
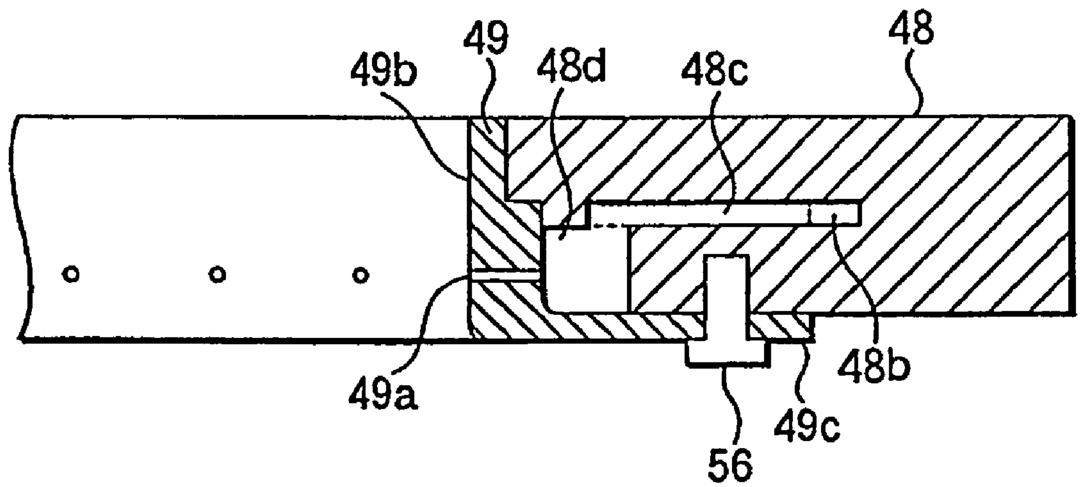
FIG. 6 depicts a cross sectional view showing a magnified portion of the gas introducing mechanism.

FIG. 6 describes a state in which the gas introducing base 48 is matched with the gas introducing plate 49 to be fixed thereto by using the screws 56. As shown in this drawing, the gas introducing base 48 is fixed together with the gas introducing plate 49 by using the screws 56 in the state in which the step portion of the gas introducing base 48 is coincided with that of the gas introducing plate 49 to be matched thereto. Further, at this time, the fourth gas flow path 48*d* is formed therebetween, so that the gas is discharged from the gas discharge holes 49*a* communicating with the fourth gas flow path 48*d*. The gas introducing plate 49 is configured to be easily attached to the gas introducing base 48 or detached therefrom by using the screws 56.

Figure 7:
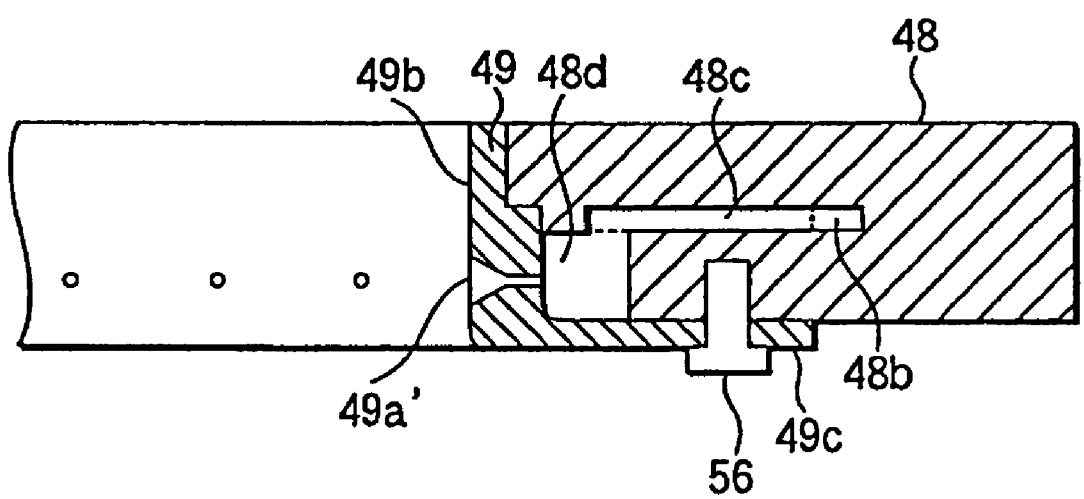
FIG. 7 describes a cross sectional view showing a modified example of the gas introducing mechanism.

As described in FIG. 7, a gas discharge hole 49*a'* may be of, e.g., a cone or a trumpet shape whose width gets wider towards the processing space S from the fourth gas flow path 48*d*. In this way, the processing gas can be supplied efficiently and uniformly into the large processing space S.

Figure 8:
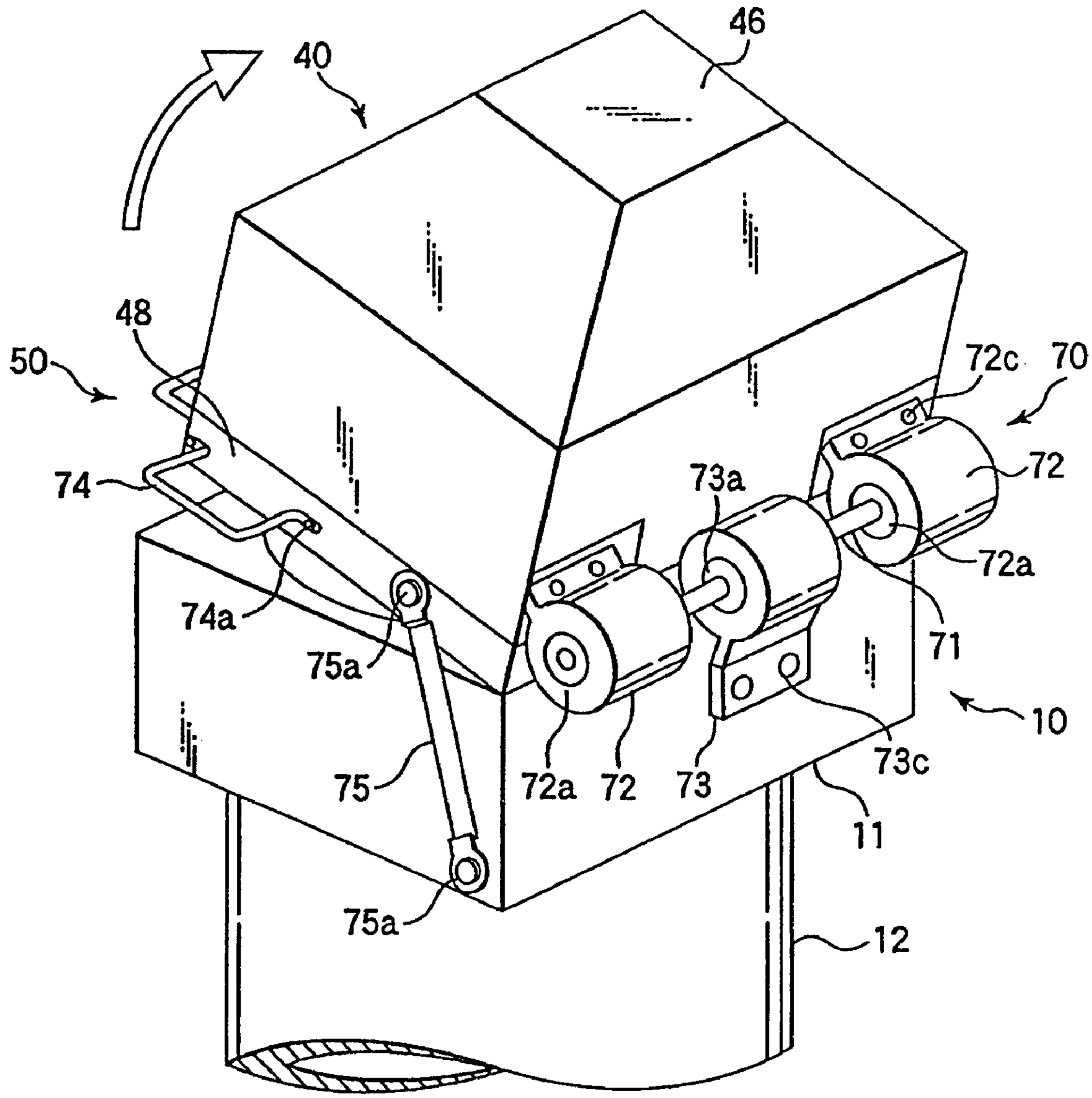
FIG. 8 offers a perspective view showing an external appearance of the plasma processing apparatus in accordance with the first embodiment of the present invention.

In the following, attaching and detaching mechanisms of the aforementioned gas introducing mechanism 50 and the plasma generation unit 40 will now be explained with reference to FIG. 8 showing an external appearance of the plasma processing apparatus 100.

As described in FIG. 8, the attaching and detaching mechanism 70 has a pair of first hinge components 72 equipped by using the screws 72*c* at one side of the gas introducing plate 48, which defines an outer periphery of the gas introducing mechanism 50; and a second hinge component 73 provided between the pair of first hinge components 72 and fixed to the main body 11 of the chamber 10 by using the screws 73*c*. In the central portions of the hinge components 72 and 73, there are provided respective bearing 72*a* and 73*a*, through which a shaft 71 is inserted. In this way, the gas introducing mechanism 50 and the plasma generation unit 40 are upwardly rotated to be detached from the chamber 10 by using the shaft 71 as a center of rotation, from the state where the gas introducing mechanism 50 having a rectangular external appearance is attached to the main body 11 of the chamber 10, wherein the main body 11 is of an identical rectangular shape. Namely, the gas introducing mechanism 50 and the plasma generation unit 40 are configured to be readily attached to the chamber 10 and detached therefrom by the attaching and detaching mechanism 70, so that a maintenance can be readily performed while the gas introducing mechanism 50 and the plasma generation unit 40 are upwardly rotated.

Further, the attaching and detaching mechanism 70 has a damper 75. One end of the damper 75 is fixed to the gas introducing plate 48 by using a fixing member 75*a*, and the other end thereof is fixed to the main body 11 of the chamber 10.

The damper 75 having therein, e.g., Hydraulic equipment, is configured to be extensible and contractible, and to apply a lifting force along a height direction, i.e., a rotation direction, when the gas introducing mechanism 50 and the plasma generation unit 40 are upwardly rotated. For the same reason, it is possible to reduce the force required for supporting the gas introducing mechanism 50 and the plasma generation unit 40, when they are rotated upward. Further, a handle 74 is provided at the gas introducing base 48 by using screws 74*a* to be gripped by the operator, when the plasma generation unit 40 being attached or detached.

In the following, a processing operation by using the plasma processing apparatus 100 as configured above will be discussed.

First, the gate valve 37 is opened to load the wafer W into the chamber 10 by using a transfer arm (not shown), and the wafer elevating pins 31 protruded from the susceptor 21 receive thereon the wafer W. Subsequently, the wafer elevating pins 31 are lowered to allow the wafer W to be mounted on the top surface of the susceptor 21; and the shadow rings 23 are lowered.

Thereafter, the gate valve 37 is closed to exhaust insides of the chamber 10 and the bell jar 41 by using the gas exhaust unit 39 to keep them at a predetermined depressurized state. In such a depressurized state, the Ar gas and the $H_2$ gas supplied from the gas supply mechanism 60 are discharged to the processing space S through the gas introducing mechanism 50. At the same time, high frequency powers are supplied to the electrode 24 inside the susceptor 21 and the coil 43 from the high frequency power supplies 25 and 44, respectively, so that an electric field is generated in the processing space S and the gas introduced into the bell jar 41 is excited to ignite the plasma.

After the ignition of the plasma, an induced current flows through the bell jar 41 to generate the plasma continuously, and a native oxide film formed on the wafer W, e.g., a silicon oxide formed on a silicon or a metal oxide film formed on a metal film, is etched to be removed by the plasma. At this time, a bias is applied to the susceptor 21 from the high frequency power supply 25, and the wafer W is kept at a predetermined temperature by the heater 28.

The conditions may be set such that a pressure of the processing space S is 0.1~13.3 Pa, and preferably, 0.1~2.7 Pa; a temperature of the wafer is 100~500° C.; a flow rate of Ar gas is 0.001~0.03 mL/min and that of $H_2$ is 0~0.06 L/min, and preferably, 0~0.03 L/min; a frequency of the high frequency power supply 44 for producing a plasma is 300 kHz~60 MHz, and preferably, 450 kHz~13.56 MHz; and a power is 500~3000 W, and a power of the high frequency power supply 25 is 0~1000 W (–20~–200 V as a bias potential). At this time, a plasma density is $0.7\sim10\times10^{10}$ atoms/$cm^2$, and preferably, $1\sim6\times10^{10}$ atoms/$cm^3$. Under such conditions, the processing is performed for about 30 seconds, so that, e.g., a silicon oxide film ($SiO_2$) is removed by about 10 nm.

As mentioned above, by removing an impurity layer containing oxides such as a native oxide film and the like, it is possible to achieve such effects that adhesivity of a film to be formed is improved and an electrical resistance value is reduced.

In this case, the gas introducing mechanism 50 for discharging the processing gas also functions to introduce the processing gas into the processing space S by being mounted on the main body 11 of the chamber 10 while keeping an airtightness, as well as to support the bell jar 41, as described above. Therefore, the number of components in the plasma processing apparatus is reduced to simplify the configuration, so that cost reduction in the plasma processing apparatus may be achieved.

Further, in case when performing the sputter etching as the plasma processing on the semiconductor wafer W as mentioned, if scattered materials are deposited to members around the semiconductor wafer W due to the sputtering, particulates such as fine particles may be generated to thereby lower the production yield of the semiconductor device. For example, the scattered materials are likely to be deposited to the members around the semiconductor wafer W, specifically, the part where deposits are accumulated, e.g., around the gas discharge holes 49*a*.

Therefore, in the present embodiment, the gas introducing plate 49 is configured to be attached to the gas introducing base 48 by using the screws 56 and detached therefrom. Accordingly, the gas introducing plate 49 may be readily replaced, and the time for maintenance may be shortened. Further, since the gas introducing plate 49 has a simple configuration and is formed of cheap components, the cost for maintenance may be kept low.

Further, as described above, the gas introducing mechanism 50 and the plasma generation unit 40 can be readily attached and detached by the attaching and detaching mechanism 70. Therefore, in case when the plasma processings are repeatedly performed, and thus, maintenance needs to be performed, the time for maintenance of the plasma processing apparatus 100 may be shortened and an operation rate thereof can be improved. Further, productivity of the semiconductor device may be improved.

To be specific, in case where the maintenance is performed on the chamber 10 when replacing the bell jar 41 or an operation such as wet-cleaning or the like is performed, the plasma generation unit 40 needs to be detached therefrom. At this time, the plasma generation unit 40 and the gas introducing mechanism 50 may be simultaneously rotated to be detached together, as mentioned above, and the maintenance operation therefor may be performed in a short time.

Further, since the gas introducing mechanism 50 and the plasma generation unit 40 can be readily attached and detached as mentioned above, an operation for replacing the gas introducing plate 49 of the gas introducing mechanism may be performed readily in a short time by detaching the gas introducing mechanism 50 and the plasma generation unit 40 from the chamber 10.

Still further, the attaching and detaching mechanism 70 has the damper 75 exerting the lifting force to the plasma generation unit 40 in its opening direction, so that it is possible to reduce the force required for supporting the plasma generation unit 40 when it being rotated. Therefore, the maintenance operation gets easier, and efficiency thereof is improved.

(Second Embodiment)

In the following, a second embodiment of the present invention will be discussed.

Figure 9:
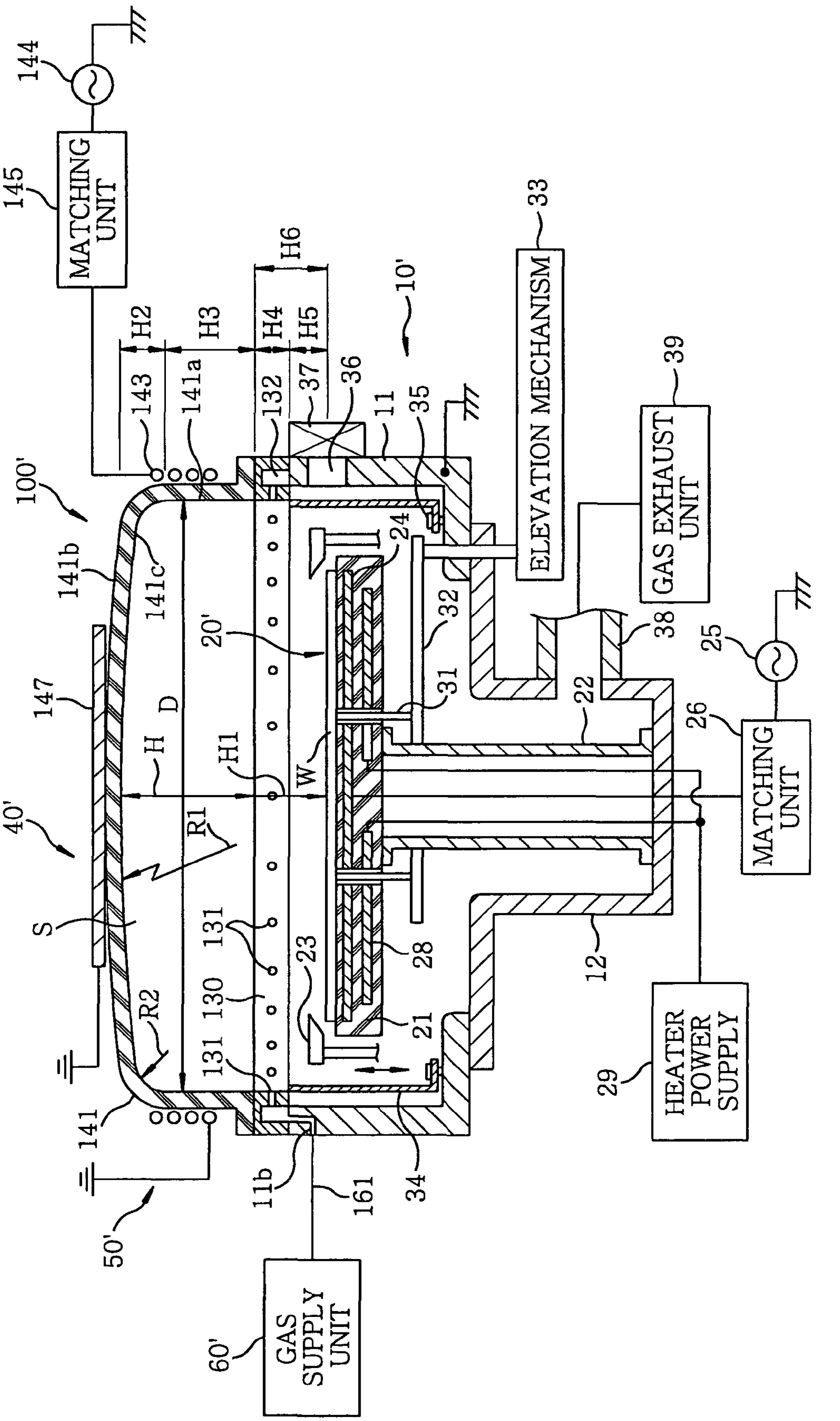
FIG. 9 shows a cross sectional view showing a plasma processing apparatus in accordance with a second embodiment of the present invention.

FIG. 9 is a schematic view of a configuration of a plasma processing apparatus in accordance with the second embodiment of the present invention. The plasma processing apparatus 100', like as the plasma processing apparatus 100 of the first embodiment, is applied to a process for plasma-etching to remove an impurity layer containing an oxide film, e.g., a native oxide film or the like, formed on a metal film or a silicon formed on a substrate to be processed. Further, the plasma processing apparatus 100' has a chamber 10' accommodating therein a semiconductor wafer as a substrate to be processed; a wafer supporting portion 20' supporting the semiconductor wafer inside the chamber 10'; a plasma generation unit 40', installed to cover the chamber 10', for producing a plasma in a processing space S where a plasma processing is performed on a wafer; a gas introducing mechanism 50' introducing into the processing space S a gas for producing a plasma; and a gas supply mechanism 60' supplying the gas for producing a plasma to the gas introducing mechanism 50'.

Among these, since the chamber 10', the wafer supporting portion 20' and neighboring members thereof are configured to be completely identical to those of the first embodiment, identical reference numerals will be used for the corresponding parts having substantially same functions and configurations of FIG. 2, and explanations thereof will be omitted.

The plasma generation unit 40' has a bell jar 141; a coil 143 as an antenna member, which is wound in an outer side of the bell jar 141; a high frequency power supply 144 supplying a high frequency power to the coil 143; and a conductive member 147 as a facing electrode provided on a ceiling wall of the bell jar 141.

The bell jar 141 made of a dielectric material such as a ceramic material, e.g., quartz, $Al_2O_3$, AlN or the like, is of a multi-radius domed shape, which has a cylindrical side wall portion 141*a*; a domed ceiling wall portion 141*b* (radius R1=1600 mm~2200 mm) formed thereon; and a curved corner portion 141*c* (radius R2=20 mm~40 mm) connecting the side wall portion 141*a* with the ceiling wall portion 141*b*. At an outer side of the side wall portion 141*a* forming a cylinder of the bell jar 141, the coil 143 is wound with a predetermined number of windings in the substantially horizontal direction at 5~10 mm pitch between coils, and preferably, 8 mm pitch; and it is supported to be fixed by using an insulating material, e.g., a fluorine resin or the like. In the drawing, the number of windings of the coil 143 is four times. The high frequency power supply 144 is connected to the coil 143 through a matching unit 145. The high frequency power supply 144 has a frequency in the range of 300 kHz~60 MHz, and preferably, 450 kHz~13.56 MHz. Further, a high frequency power is supplied from the high frequency power supply 144 to the coil 143 to generate an inductive electromagnetic field in the processing space S inside the bell jar 141 through the side wall portion 141*a* thereof, which is made of a dielectric material.

The gas introducing mechanism 50' has a ring-shaped gas introducing member 130 provided between the chamber 10' and the bell jar 141. The gas introducing member 130 made of a conductive material such as Al or the like is grounded. A number of gas discharge holes 131 are formed in the gas introducing member 130 along the inner peripheral surface thereof. Further, inside the gas introducing member 130, there is provided an annular gas flow path 132, into which an Ar gas, an $H_2$ gas and the like are supplied from the gas supply mechanism 60', as explained below; and thus, these gases are discharged through the gas flow path 132 to the processing space S through the gas discharge holes 131. The gas discharge holes 131 are formed horizontally to supply the processing gas into the bell jar 141. Further, the gas discharge holes 131 may be formed to be tilted upward, to thereby supply the processing gas towards the central portion of the bell jar 141.

The gas supply mechanism 60' for introducing a gas for plasma processing into the processing space S has a gas supply source, an opening/closing valve and a mass flow controller for controlling a flow rate (all of them not shown), e.g., like the gas supply mechanism 60 shown in FIG. 2; and it supplies a predetermined gas to the gas introducing member 130 through a gas line 161. Further, valves and mass flow controllers of the respective lines are controlled by using a controller (not shown).

As a gas for plasma processing, there are illustrated Ar, Ne and He that may be individually employed. Further, any of Ar, Ne and He may be used together with $H_2$, and any of them may be used together with $NF_3$. Among these, as described in FIG. 2, it is preferable that Ar is used individually, or together with $H_2$. The gas for plasma processing is properly selected based on a target to be etched.

The conductive member 147 serves as a facing electrode, and at the same time, functions to pressurize the bell jar 141; and it is made of aluminum, whose surfaces are anodized, aluminum, stainless steel, titan and the like.

In the following, the bell jar 141 will now be explained in detail.

In the present embodiment, a flatness of the bell jar 141 is regulated to increase the in-surface uniformity in the etching by improving the uniformity in the plasma.

Namely, the flatness K (=D/H), which is defined as a ratio D/H between an inner diameter D of the side wall portion 141*a* of the bell jar 141 and a height H of the central portion of the domed ceiling wall portion 141*b*, is configured to be in the range of 1.60~9.25.

If the flatness K is smaller than 1.60, the in-surface uniformity cannot be improved. Further, if the flatness K is greater than 9.25, winding of the coil 143 required for producing a plasma becomes difficult in practice.

Further, the flatness K1 (=D/H1), which is defined as a ratio D/H1 between the inner diameter D of the cylindrical side wall portion 141*a* of the bell jar 141 and a height H1 from the top surface of the susceptor 21 in a central portion of the domed ceiling wall portion 141*b*, is configured to be in the range of 0.90~3.85.

Under such a flatness condition, the number of windings of the coil 143 may be consequently ten times or less, preferably 7~2 times, and more preferably, 4~2 times.

With respect to the bell jar 141, values of the height H of the central portion of the domed ceiling wall portion 141*b*, the height H1 from the top surface of the susceptor 21 in the central portion of the domed ceiling wall portion 141*b* and the inner diameter D of the cylindrical side wall portion 141*a* are, e.g., H=98 mm, H1=209 mm and D=450 mm, respectively. At this time, the flatnesses K and K1 are 4.59 and 2.15, respectively.

Further, an example of dimensional relationships between other parts is as described below. Given that an inside measurement of height with respect to the domed portion of the bell jar 141 is H2; a height in the cylindrical portion of the bell jar 141 is H3 (i.e., H=H2+H3); a thickness of the gas introducing member 130 is H4; a height from the top surface of the susceptor 21 to a top surface of the opening in the chamber 10' (a mounting surface of the gas introducing member 130) is H5; and a height from the top surface of the susceptor 21 to a top surface of the gas introducing member 130 is H6, respective dimensional values and ratios thereof are as described below.

Namely, a ratio K2 is H/H6, i.e., about 0.55~1.50. A ratio K3 is H2/H3, i.e., 2.1 or less, preferably 0.85 or less, and more preferably, 0.67 or less.

Further, a ratio K4 is H2/(H3+H6), i.e., below 0.75, preferably 0.65 or less, and more preferably, about 0.55 or less.

Still further, in case where H2 is about 29~74 mm, H6+H3 is about 97~220 mm. In case where H3 is about 35 mm or greater, H5+H4 is about 62~120 mm. In case where H2 is about 29 mm, if H3 is about 35~100 mm, H5 is about 0~72 mm, and preferably, about 22~72 mm.

In case of employing such a bell jar 141 formed by the ratios as mentioned above, a high plasma density area in an outer peripheral portion inside the bell jar 141 is shifted towards the wafer W, so that an area having uniformized plasma density can be expanded. Accordingly, a plasma is uniformly generated in a part where the wafer W is present, so that an etching uniformity gets improved. For the same reason, it is effective for a wafer (substrate) of a large diameter, particularly.

In the following, a processing operation by the plasma processing apparatus 100' as configured above will be discussed.

First, the gate valve 37 is opened to load the wafer W into the chamber 10' by using a transfer arm (not shown), and the wafer elevating pins 31 protruded from the susceptor 21 receive thereon the wafer W. Subsequently, the wafer elevating pins 31 are lowered to allow the wafer W to be mounted on the susceptor 21, and the shadow rings 23 are lowered.

Thereafter, the gate valve 37 is closed to exhaust insides of the chamber 10' and the bell jar 141 by using the gas exhaust unit 39 to be kept at a predetermined depressurized state. In such a depressurized state, a predetermined gas, e.g., an Ar gas, supplied from the gas supply mechanism 60' is discharged to the bell jar 141 from the gas discharge holes 131 of the gas introducing member 130. At the same time, high frequency powers of, e.g., 0~1000 W and 500~3000 W are supplied into the electrode 24 inside the susceptor 21 and the coil 143 from the high frequency power supply 25 for bias and the high frequency power supply 144 for producing a plasma, respectively. Accordingly, an electric field is generated between the coil 143 and the conductive member 147, and the gas introduced into the bell jar 141 is excited to ignite the plasma. After the ignition of the plasma, an induced current flows through the bell jar 141 to generate the plasma continuously, and a native oxide film formed on the wafer W, e.g., a silicon oxide formed on the silicon or a metal oxide film formed on the metal film, is etched to be removed by the plasma. At this time, a bias is applied to the susceptor 21 by the high frequency power supply 25, and the wafer W is kept at a predetermined temperature by the heater 28. The temperature is 20~800° C., and preferably, 20~200° C.

At this time, a plasma density is $0.7\sim10\times10^{10}$ atoms/$cm^3$, and preferably, $1\sim6\times10^{10}$ atoms/$cm^2$. By performing a processing for about 30 seconds by using such a plasma, a silicon oxide film ($SiO_2$) is removed by, e.g., about 10 nm.

As described above, by removing the impurity layer containing oxides such as a native oxide film and the like, adhesivity of a film to be formed may be improved, and an electrical resistance value may be reduced.

Herein, in case of the present embodiment, the flatness K of the bell jar 141 is set to 1.60~9.25, or the flatness K1 is set to 0.90~3.85, as described above, so that the plasma formed in the bell jar 141 spreads uniformly over the whole surface of the wafer W. Further, since the high plasma density area in the outer peripheral portion inside the bell jar 141 is shifted towards the wafer W, an etching processing is performed uniformly on the whole surface of the wafer W, and thus, the in-surface uniformity in the etching is improved. In this case, by regulating R1 and R2 as 1600 mm~2200 mm and 20 mm~40 mm, respectively, and particularly, making R1 large, a cross sectional shape of the bell jar 141 becomes of a near rectangular flat shape and the plasma is formed in the bell jar 141 to spread more uniformly over the whole surface of the wafer W. Therefore, the etching processing is performed uniformly on the whole surface of the wafer W by using the plasma, so that the in-surface uniformity in the etching is improved.

Figure 10A:
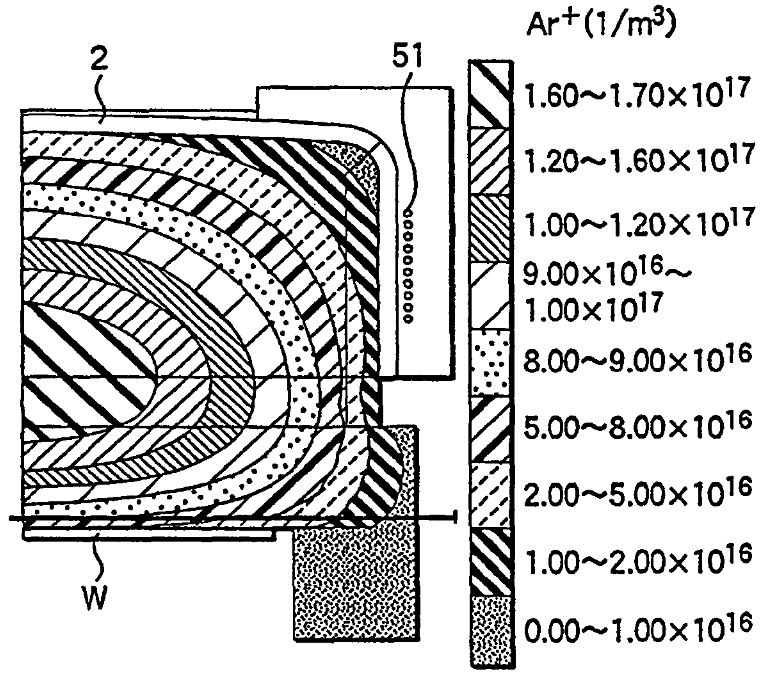
FIG. 10A is a view showing a simulation result of a density distribution of $Ar^+$ in Ar plasma of the conventional plasma processing apparatus.
Figure 10B:
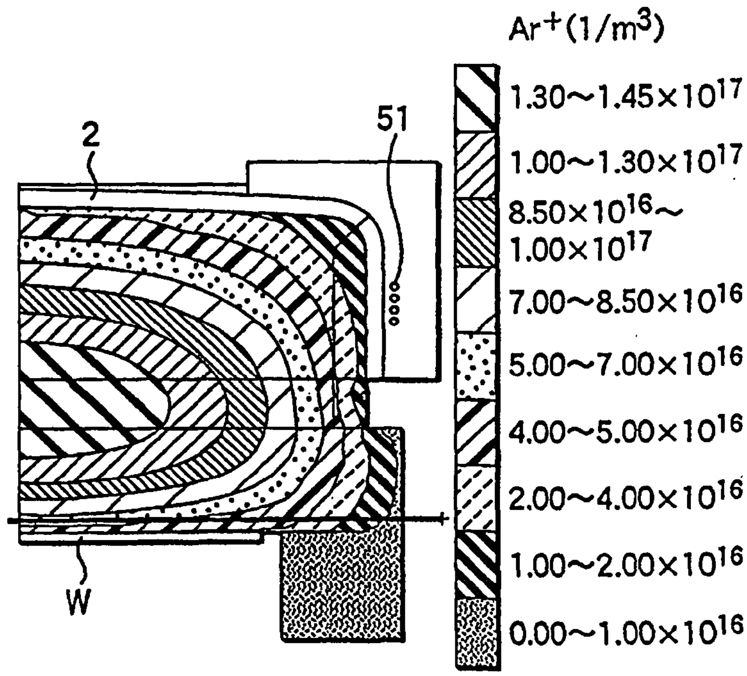
FIG. 10B provides a view showing a simulation result of a density distribution of $Ar^+$ in plasma for the plasma processing apparatus in accordance with the second embodiment of the present invention.

FIG. 10A shows a simulation result of an $Ar^+$ density distribution of Ar plasma in the bell jar, in case of the conventional bell jar having a high height (the height H is 137 mm, the inner diameter D is 450 mm and the number of windings of the coil is ten times); and FIG. 10B shows a simulation result of an $Ar^+$ density distribution in the plasma with respect to the bell jar 141 (the height H is 98 mm, the inner diameter D is 450 mm and the number of windings of the coil is four times) of the present embodiment.

These simulation results support the fact that the $Ar^+$ density distribution spreads uniformly in the plane direction of the wafer W and the in-surface uniformity in the etching of the wafer W by the plasma is improved in case of the present embodiment having more flat shape shown in FIG. 10B, as compared to the conventional art of FIG. 10A.

Namely, for improving the etching uniformity, it is required to uniformly generate the plasma ($Ar^+$ ion density) in the top surface area of the wafer. Therefore, it is preferable that the wafer W is completely immersed in the area where the $Ar^+$ ion density is uniformly formed, in order to form the area having the uniformized plasma.

Consequently, if the bell jar 141 is configured to be expanded laterally, the plasma gets spread wider. But, the apparatus becomes large, the plasma density is reduced, and more power is required. Thus, an increase in the cost of the apparatus is incurred.

In case of the present embodiment, since the flatnesses K and K1 of the bell jar 141, the ratios K2~K4, and the height H1 from the top surface of the mounting table to the ceiling portion of the bell jar 141 are optimized, the plasma density may be kept even at low cost and the uniformity may be improved without scaling up the apparatus or increase in power consumption.

Figure 11:
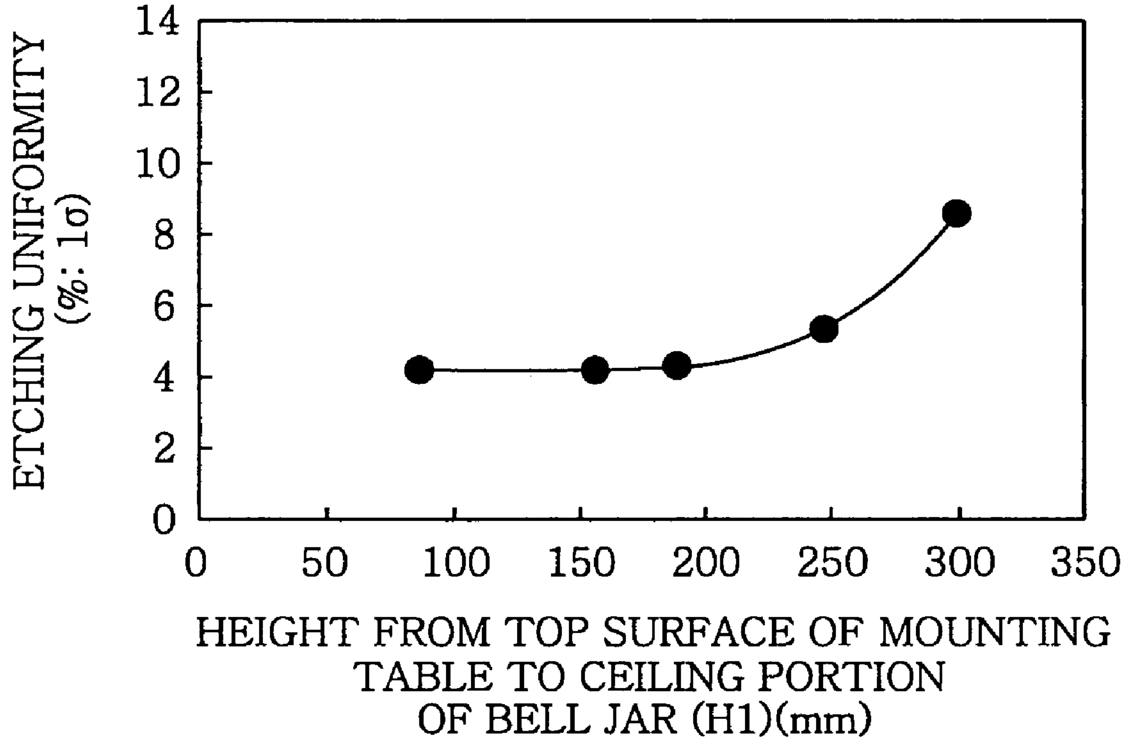
FIG. 11 presents a graph showing an exemplary effect of a shape of a bell jar for the plasma processing apparatus in accordance with the second embodiment of the present invention.

FIG. 11 shows an example of a relationship between the height H1 from the top surface of the mounting table to the ceiling portion of the bell jar 141 and the etching uniformity. As illustrated in FIG. 11, the etching uniformity is substantially constant until H1 becomes 210 mm, but it significantly decreases if H1 becomes higher than 250 mm. Accordingly, in case of the present embodiment, H1 is set to 209 mm as an example, as mentioned above, so that good etching uniformity is obtained.

Further, in the present embodiment, the number of windings of the coil 143 is reduced and the height of the bell jar 141 is lowered to make the bell jar 141 flatter, but the chamber 10' employs the configuration of the conventional art. The reason is that by employing same common designs for the susceptor, the gate valve and the like in the chamber as the ones used for other processing apparatus, e.g., such as a film forming apparatus, it is possible to cut the production cost of the chamber. Further, by employing a same common external transfer mechanism for loading/unloading the wafers into/from the chamber and a same common connection structure to load-lock chambers in multiple species of processing apparatus, e.g., film forming apparatus and etching apparatus, that is, by standardizing them, it becomes easy to form a multi-chamber apparatus by connecting multiple processing apparatuses together.

In other words, in accordance with the plasma processing apparatus of the present embodiment, since the chamber of the conventional art is employed as it is, it is possible to realize the improvement of the in-surface uniformity in the plasma processing on the wafer while suppressing running cost increase as well as maintaining the universality.

Figure 12:
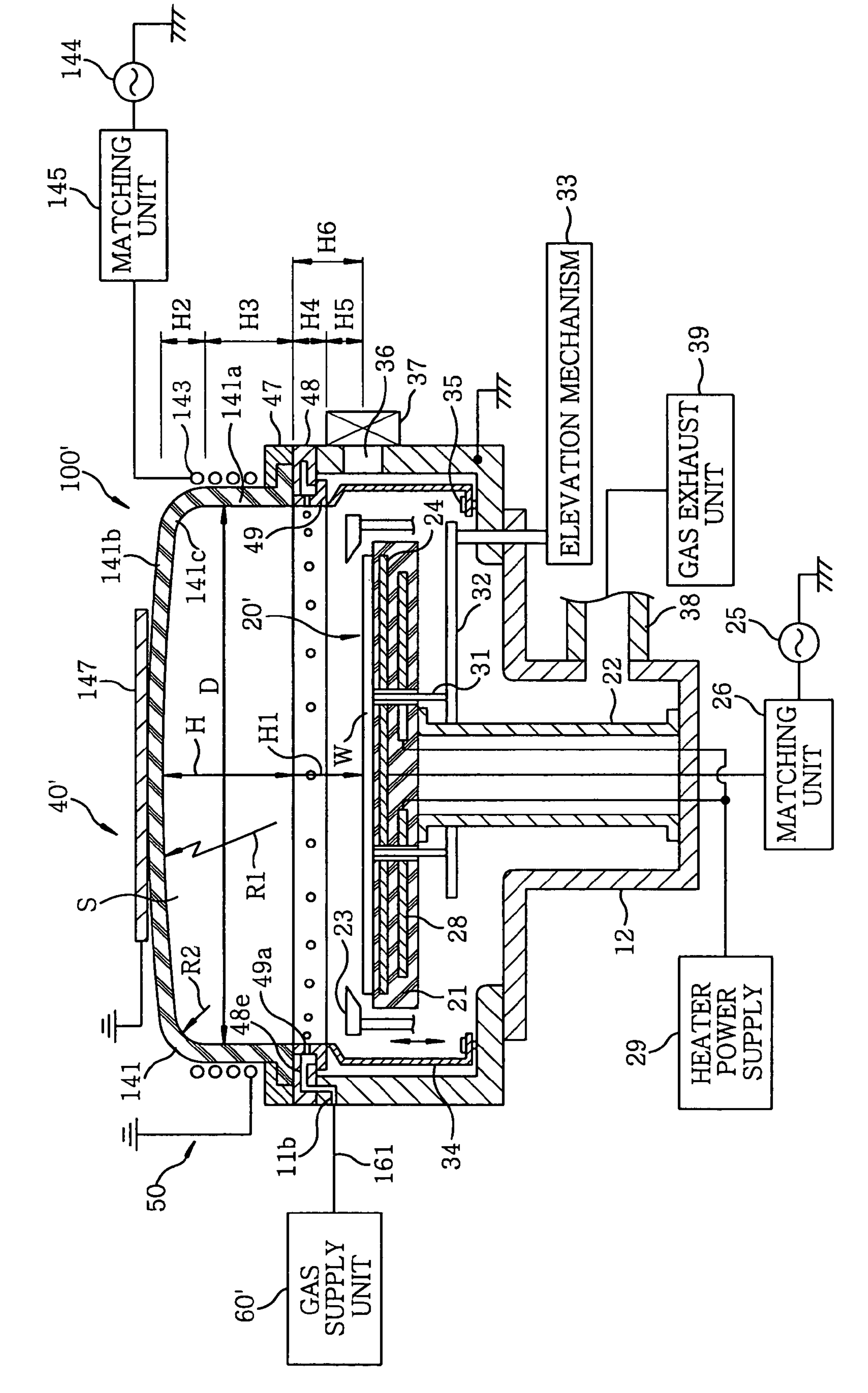
FIG. 12 sets forth a cross sectional view showing a modified example of the plasma processing apparatus in accordance with the second embodiment of the present invention.

In the plasma processing apparatus of the present embodiment, it is preferable that the identical gas introducing mechanism to that in the first embodiment is employed. A configuration thereof is shown in FIG. 12. The plasma processing apparatus shown in the drawing employs the gas introducing mechanism 50 of the first embodiment, instead of using the gas introducing mechanism 50' shown in FIG. 9. Other configurations are the same as in the FIG. 9.

Further, in the present embodiment, it is preferable to prepare the same attaching and detaching mechanism as the attaching and detaching mechanism 70 of the first embodiment.

(Third Embodiment)

In the following, a third embodiment of the present invention will be explained. The third embodiment is characterized by a mounting configuration of the semiconductor wafer W as a substrate to be processed.

Figure 13:
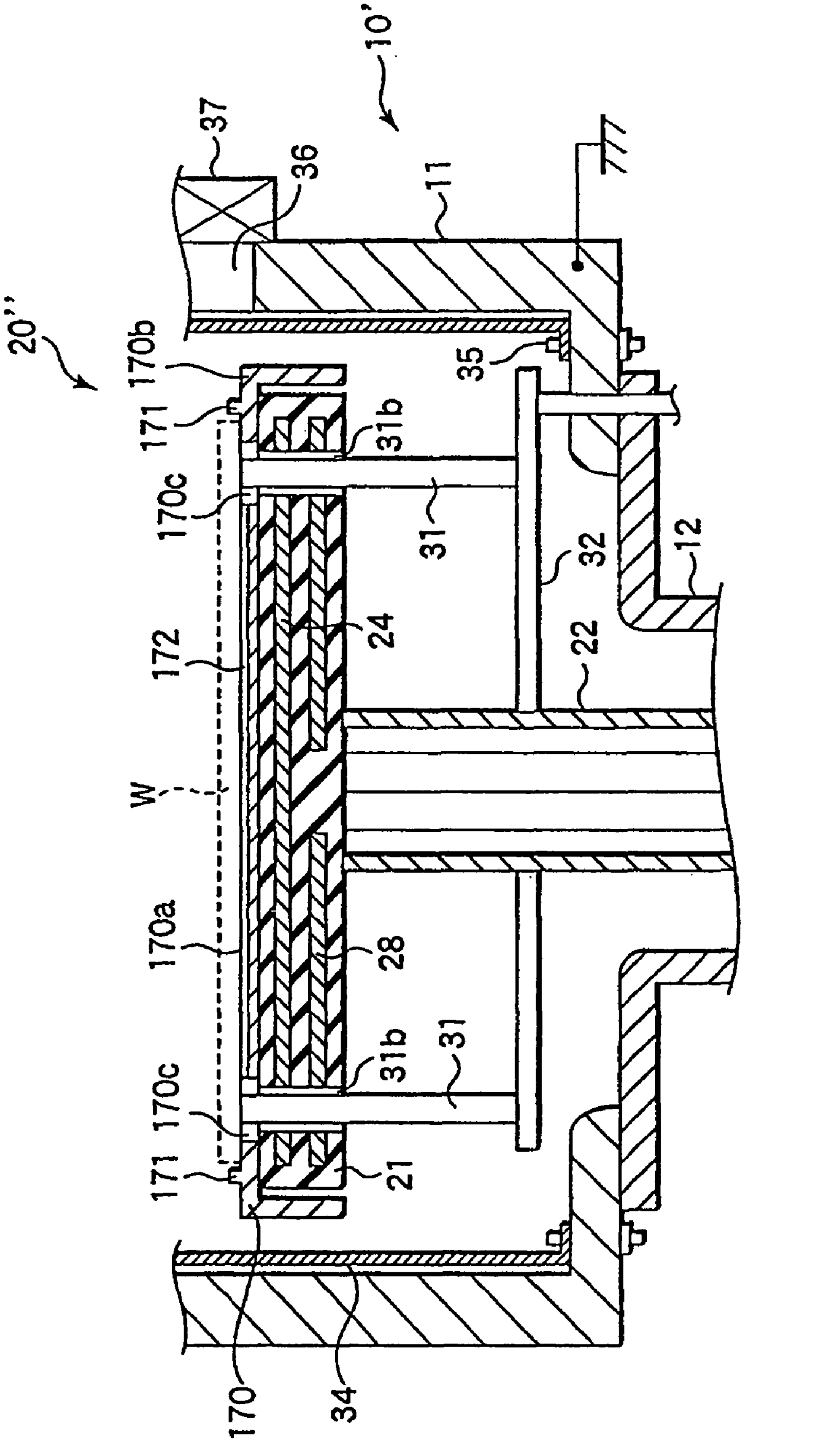
FIG. 13 describes a schematic cross sectional view showing a mounting configuration of the semiconductor wafer for a plasma processing apparatus in accordance with a third embodiment of the present invention.

FIG. 13 is a schematic cross sectional view showing a mounting configuration of the semiconductor wafer in the plasma processing apparatus in accordance with the third embodiment of the present invention. In the present embodiment, a cap shaped mask plate 170 is provided on a susceptor 21 attachably and detachably to form a wafer supporting portion 20"; and the wafer W is configured to be mounted on a surface of the mask plate 170. Since the mounting configuration of the semiconductor wafer or configurations around the chamber are the same as in the second embodiment, identical reference numerals in FIG. 13 will be used for the corresponding parts having substantially same functions and configurations of FIG. 10 in the second embodiment, and explanations thereof will be simplified.

The mask plate 170 is made of a dielectric material such as quartz ($SiO_2$) or the like. The mask plate 170 is provided to perform an initialization of the chamber 10' by performing a plasma processing while the wafer W is not mounted, and to prevent contaminants from being scattered from the susceptor 21 to the wafer W. Specifically, it is effective in case when performing an etching to remove the oxide on the silicon.

Figure 14:
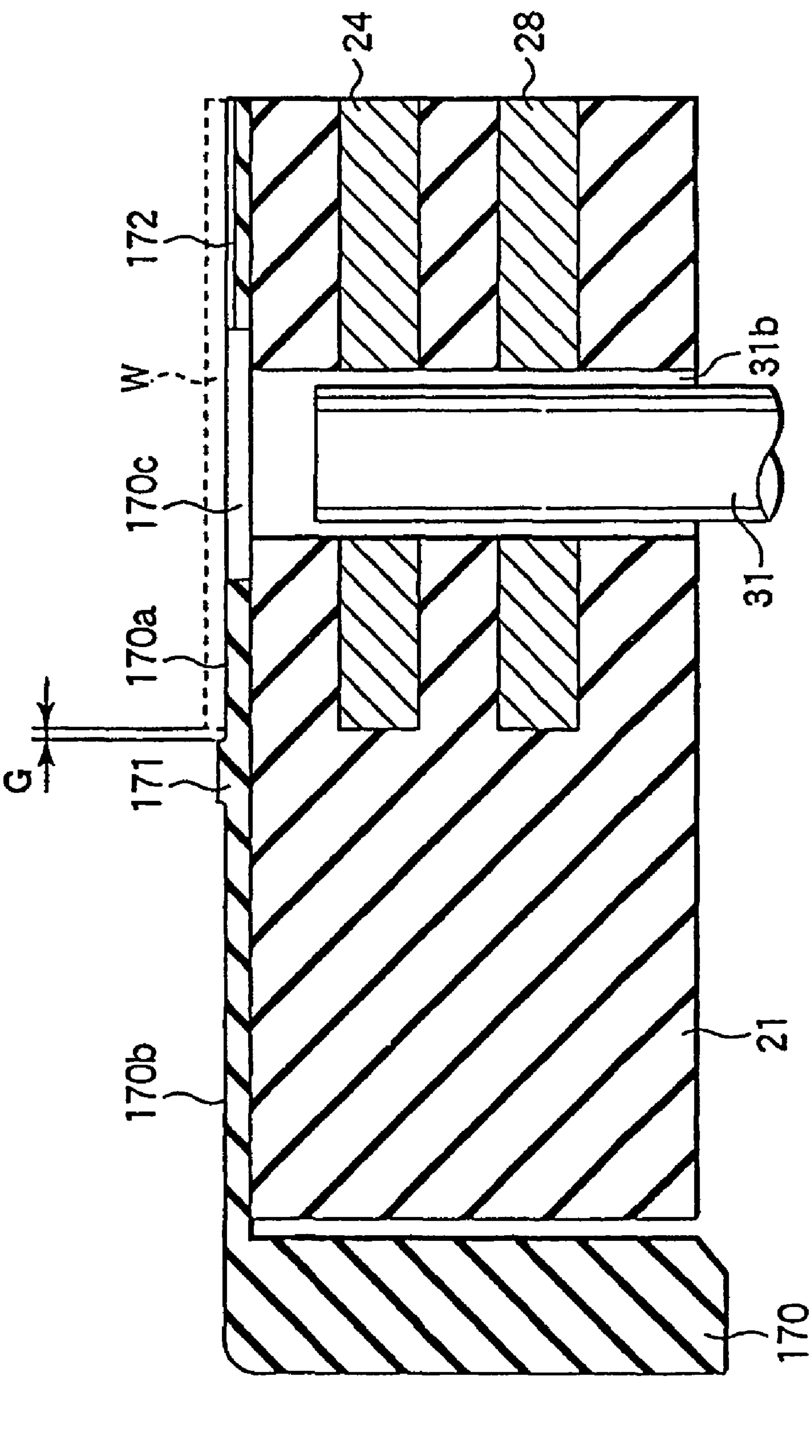
FIG. 14 offers a cross sectional view showing a magnified mounting configuration of the semiconductor wafer of FIG. 13.

As described in the magnified cross sectional view of FIG. 14, a top surface of the mask plate 170 is configured to be flat such that a wafer mounting region 170*a* making a contact with a rear surface of the wafer W and an outer peripheral region 170*b* have the same thickness (height) without having a step portion.

As an example, in case where a diameter of the wafer W is 300 mm, an outer diameter of the mask plate 170 is, e.g., 352 mm.

In the susceptor 21 and the mask plate 170, there are formed, at positions corresponding to the wafer mounting region 170*a*, through holes 31*b* and 170*c* into which three wafer elevating pins 31 (only two of them are shown) for supporting and elevating the wafer W are inserted. The wafer elevating pins 31 are configured to be popped out from or popped into the top surface of the mask plate 170 via the through holes 31*b* and 170*c*.

Figure 15:
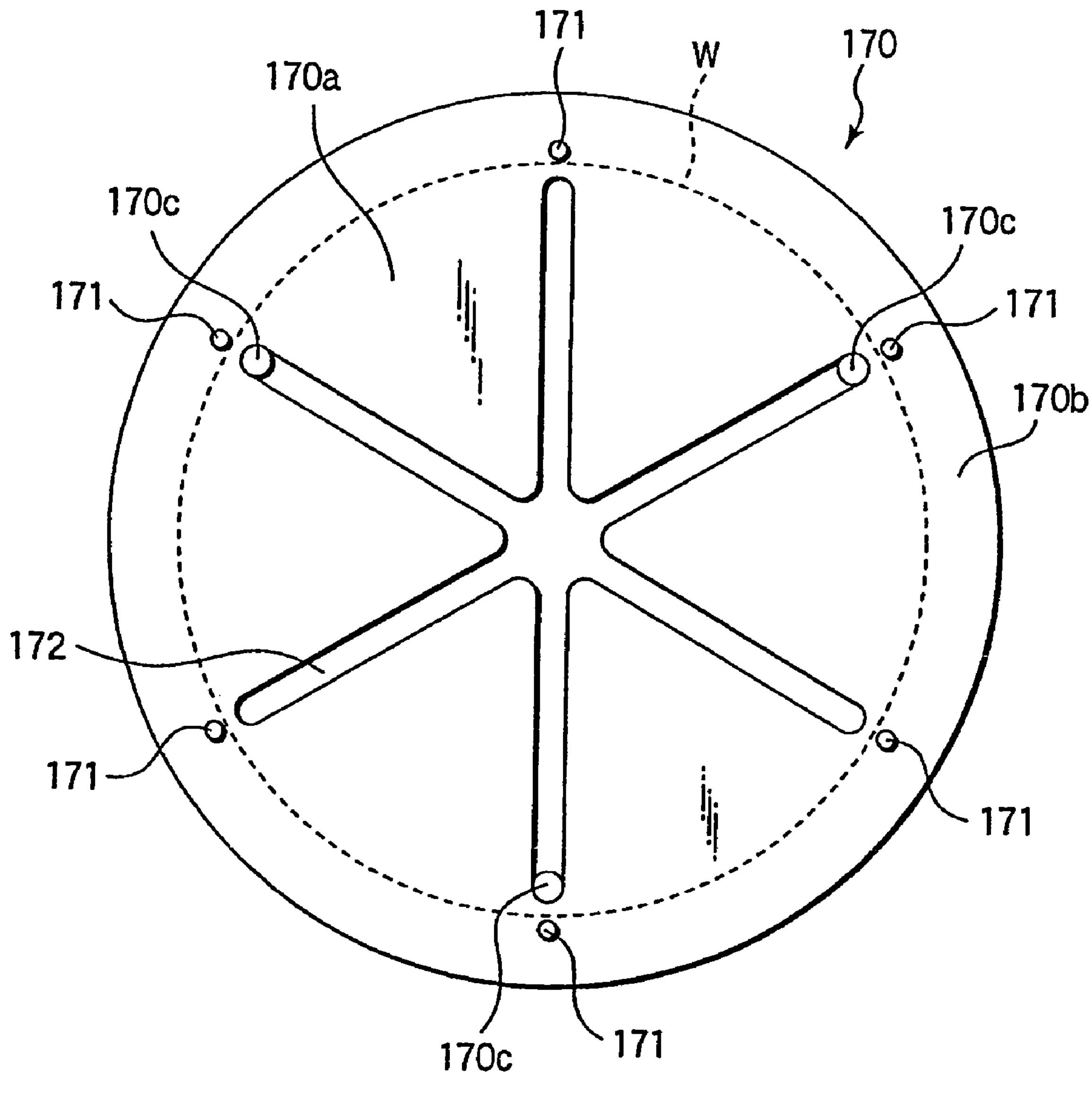
FIG. 15 is a plane view showing the mounting configuration of the semiconductor wafer of FIG. 13.

As illustrated in FIG. 15, in the peripheral region 170*b* of the top surface of the mask plate 170, there are almost equi-spacedly arranged plural positioning projections 171 (six in the present embodiment) to surround the outer periphery of the wafer W along the circumferential direction, to thereby prevent a position of the wafer W mounted on the wafer mounting region 170*a* from being shifted off from each other. As illustrated in FIG. 14, a diameter of a region, where the positioning projections 171 are arranged, is set such that a gap G between the outer periphery of the wafer W disposed at an inner side thereof and the respective positioning projections 171 is 0.5~2 mm, and preferably, 1 mm.

As for dimensions of each positioning projection 171, the height may be lower than the thickness of the wafer W, i.e., 0.775 mm or less, preferably 0.7 mm or less, and more preferably 0.05~0.3 mm or less; and the diameter is 0.2~5 mm. As an example of the dimensions of each positioning projection 171, the diameter is 2.4 mm and the height is 0.3 mm. In the surface of the mask plate 170 having a diameter of 352 mm, an area occupied by these positioning projections 171 is negligibly small. Namely, the peripheral region 170*b* on the surface of the mask plate 170 is flat and has a substantially same height as the wafer mounting region 170*a*.

In the wafer mounting region 170*a* on the top surface of the mask plate 170, there are radially provided ventilation grooves 172 from the central portion. One ends of the ventilation grooves 172 communicate with the through holes 170*c* and 31*b* into which the wafer elevating pins 31 are inserted. Further, when the wafer W is mounted on the wafer mounting region 170*a* in the mask plate 170, an atmosphere between the rear surface of the wafer W and the mask plate 170 is rapidly discharged towards a rear surface of the susceptor 21 via the ventilation grooves 172 and the through holes 170*c* and 31*b*. In this way, the wafer W can be prevented from being shifted in an unstable movable state. Further, a stable and rapid mounting operation may be performed.

Contrary to this, when the wafer W is levitated from the mask plate 170 by an operation for elevating the wafer elevating pins 31, an atmosphere of the rear surface of the susceptor 21 is introduced into the rear surface of the wafer W via the through holes 31*b* and 170*c* and the ventilation grooves 172. Accordingly, it can be prevented that the rear surface of the wafer W comes to have a negative pressure to generate an adsorption force, which opposes the levitation of the wafer W, and thus the rapid levitating operation of the wafer W may be realized.

Here, with respect to the mask plate 170 illustrated in FIGS. 13~15, the wafer mounting region 170*a* making a contact with the rear surface of the wafer W to be mounted and the outer peripheral region 170*b* are configured to be flat with the same thickness (height) without having a step portion. Therefore, an impedance distribution inside the top surface of the mask plate 170 (susceptor 21) becomes uniform over the wafer mounting region 170*a* and the outer peripheral region 170*b* when producing a plasma. For the same reason, the density distribution of the plasma becomes uniform over the top surface of the wafer mounting region 170*a* and the outer peripheral region 170*b*; a nonuniformity in the processing, such as a difference between etching rate at central portion of the wafer W and that at peripheral portion thereof, caused by a difference in the impedance distribution, can be solved; and the in-surface uniformity in the plasma processing such as an etching process can be improved over the whole surface of the wafer W.

Figure 16:
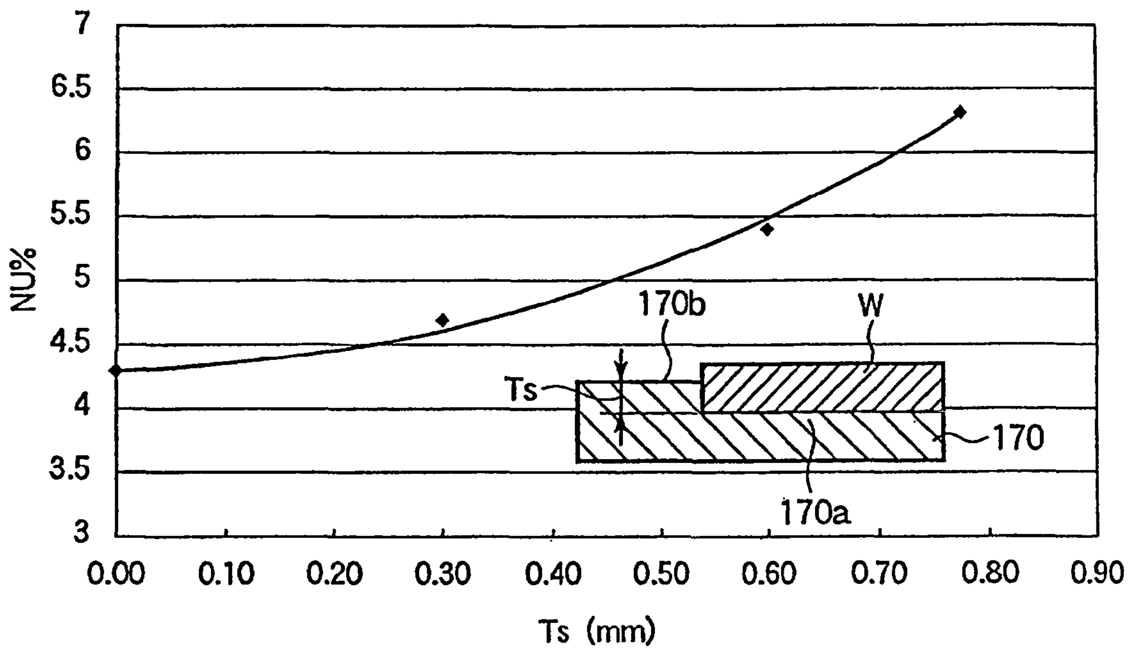
FIG. 16 presents a graph showing a relationship between a variation in an etching result and a step height of a mounting portion of the semiconductor wafer in accordance with the third embodiment of the present invention.

FIG. 16 is a graph showing a value of a height dimension Ts (horizontal axis: unit mm) in a corresponding step portion, and a nonuniformity NU (vertical axis: unit %, it is represented as a percentage of the number of measurement results, which fall outside the range of 10, against the total measurement results; and it is getting more uniform as it getting smaller) in an etching result, in case where a step portion for positioning the wafer W is formed in the wafer mounting region 170*a* of the mask plate 170.

As is clear from FIG. 16, if the value of Ts becomes small, the nonuniformity NU % in the etching gets small. Further, it can be noted that if Ts is zero (it corresponds to a case where the wafer mounting region 170*a* and the peripheral region 170*b* are flat without making the step portion), the nonuniformity becomes minimized, and thus the in-surface uniformity becomes optimal.

Same as in the present embodiment, in case where the wafer mounting configuration having the mask plate 170 is applied to the plasma processing apparatus 100' having the flat bell jar 141 in accordance with the second embodiment shown in FIG. 10, it is expected that the in-surface uniformity is further improved due to a synergy effect that the density distribution of the plasma is uniform by using the flat bell jar 141.

Further, even in case where the wafer mounting configuration having the mask plate 170 of the present embodiment is applied to the conventional plasma processing apparatus having a bell jar wherein the number of windings of the coil 143 is seven times or more and the height thereof is relatively high, an effect of improving the in-surface uniformity may be obtained.

Still further, the aforementioned embodiments are merely intended to clarify the technology of the present invention. The present invention is not limited to the aforementioned embodiments, and various changes and modifications may be made without departing from the spirit and scope of the invention.

For example, while the aforementioned embodiments describe the case where the present invention is applied to the apparatus performing a removal of the native oxide film, the present invention may be applied to a plasma etching apparatus performing a contact etching and the like, and further, it can be applied to an additional plasma etching apparatus. Further, the semiconductor wafer was explained as an example of an object to be processed, but it is not limited thereto. The present invention may be employed in other objects to be processed, e.g., an LCD substrate and the like.

Further, it may be within the present invention that the constituents of the aforementioned embodiments may be properly combined, or a certain portion thereof may be removed without departing from the spirit and scope of the invention.

What is claimed is:

1. A plasma processing apparatus for performing a plasma processing on a substrate to be processed, the apparatus comprising:

- a chamber accommodating therein the substrate to be processed;
- a plasma generation unit, having a bell jar and an antenna, for producing a plasma inside the bell jar, wherein the bell jar made of a dielectric material is provided above the chamber to communicate therewith and the antenna is coiled around an outer side of the bell jar to generate an induced electric field in the bell jar;
- a processing gas introducing mechanism, provided between the plasma generation unit and the chamber, for introducing a processing gas for producing a plasma into a processing space formed by the plasma generation unit and the chamber; and
- a mounting table for mounting the substrate to be processed provided in the chamber,
- wherein, given that an inner diameter of the bell jar is D and an inside measurement of height in a central portion of the bell jar is H, a flatness K defined by a ratio D/H is in the range of 1.60~9.25,
- wherein the plasma processing apparatus further comprises a mask made of a dielectric material, the mask covering the mounting table,
- wherein the mask has a first region where the substrate to be processed is mounted and a second region surrounding the first region,
- wherein, in the second region, there are provided plural projections for positioning the substrate to be processed at a position of the first region, the projections being spaced apart from each other,
- wherein, in the first region, there are provided a number of pin holes through which elevating pins for elevating the substrate to be processed from the mounting table penetrate; and ventilation grooves communicating with the pin holes, and
- wherein an upper surface of the first region except the ventilation grooves is flush with an upper surface of the second region except the projections.

2. A plasma processing apparatus for performing a plasma processing on a substrate to be processed, the apparatus comprising:

- a chamber accommodating therein the substrate to be processed;
- a plasma generation unit, having a bell jar and an antenna, for producing a plasma inside the bell jar, wherein the bell jar made of a dielectric material is provided above the chamber to communicate therewith and the antenna is coiled around an outer side of the bell jar to generate an induced electric field in the bell jar;
- a processing gas introducing mechanism, provided between the plasma generation unit and the chamber, for introducing a processing gas for producing a plasma into a processing space formed by the plasma generation unit and the chamber; and a mounting table for mounting the substrate to be processed provided in the chamber, wherein, given that an inner diameter of the bell jar is D and a distance from a ceiling portion of a central portion of the bell jar to the mounting table is H1, a flatness K1 defined by a ratio D/H1 is in the range of 0.90~3.85, wherein the plasma processing apparatus further comprises a mask made of a dielectric material, the mask covering the mounting table, wherein the mask has a first region where the substrate to be processed is mounted and a second region surrounding the first region, wherein, in the second region, there are provided plural projections for positioning the substrate to be processed at a position of the first region, the projections being spaced apart from each other, wherein, in the first region, there are provided a number of pin holes through which elevating pins for elevating the substrate to be processed from the mounting table penetrate; and ventilation grooves communicating with the pin holes, and wherein an upper surface of the first region except the ventilation grooves is flush with an upper surface of the second region except the projections.

3. The plasma processing apparatus of claim 1, wherein the mask is attachably and detachably provided on the mounting table.

4. The plasma processing apparatus of claim 1, wherein the projections are almost equi-spacedly arranged to surround an outer periphery of the substrate to be processed along a circumferential direction of the mounting table.

5. The plasma processing apparatus of claim 1, wherein an upper surface of the projection is lower than an upper surface of the substrate to be processed.

6. The plasma processing apparatus of claim 1, wherein a diameter of the projection is about 0.25 mm.

7. The plasma processing apparatus of claim 2, wherein the mask is attachably and detachably provided on the mounting table.

8. The plasma processing apparatus of claim 2, wherein the projections are almost equi-spacedly arranged to surround an outer periphery of the substrate to be processed along a circumferential direction of the mounting table.

9. The plasma processing apparatus of claim 2, wherein an upper surface of the projection is lower than an upper surface of the substrate to be processed.

10. The plasma processing apparatus of claim 2, wherein a diameter of the projection is about 0.25 mm.

11. A plasma processing apparatus for performing a plasma processing on a substrate to be processed, the apparatus comprising:

a chamber accommodating therein the substrate to be processed;

a plasma generation unit, having a bell jar and an antenna, for producing a plasma inside the bell jar, wherein the bell jar made of a dielectric material is provided above the chamber to communicate therewith and the antenna is coiled around an outer side of the bell jar to generate an induced electric field in the bell jar;

a processing gas introducing mechanism, provided between the plasma generation unit and the chamber, for introducing a processing gas for producing a plasma into a processing space formed by the plasma generation unit and the chamber; and a mounting table for mounting the substrate to be processed provided in the chamber, wherein, given that an inner diameter of the bell jar is D and an inside measurement of height in a central portion of the bell jar is H, a flatness K defined by a ratio D/H is in the range of 1.60~9.25.

12. The plasma processing apparatus of claim 11, wherein the plasma processing apparatus further comprises a mask made of a dielectric material, the mask covering the mounting table, and wherein the mask has a first region where the substrate to be processed is mounted and a second region surrounding the first region.

13. A plasma processing apparatus for performing a plasma processing on a substrate to be processed, the apparatus comprising:

a chamber accommodating therein the substrate to be processed;

a plasma generation unit, having a bell jar and an antenna, for producing a plasma inside the bell jar, wherein the bell jar made of a dielectric material is provided above the chamber to communicate therewith and the antenna is coiled around an outer side of the bell jar to generate an induced electric field in the bell jar;

a processing gas introducing mechanism, provided between the plasma generation unit and the chamber, for introducing a processing gas for producing a plasma into a processing space formed by the plasma generation unit and the chamber; and a mounting table for mounting the substrate to be processed provided in the chamber, wherein, given that an inner diameter of the bell jar is D and a distance from a ceiling portion of a central portion of the bell jar to the mounting table is H1, a flatness K1 defined by a ratio D/H1 is in the range of 0.90~3.85.

14. The plasma processing apparatus of claim 13, wherein the plasma processing apparatus further comprises a mask made of a dielectric material, the mask covering the mounting table, and wherein the mask has a first region where the substrate to be processed is mounted and a second region surrounding the first region.

15. The plasma processing apparatus of claim 12, wherein the mask is attachably and detachably provided on the mounting table.

16. The plasma processing apparatus of claim 12, wherein, in the second region, there are provided plural projections for positioning the substrate to be processed at a position of the first region, the projections being spaced apart from each other.

17. The plasma processing apparatus of claim 16, wherein the projections are almost equi-spacedly arranged to surround an outer periphery of the substrate to be processed along a circumferential direction of the mounting table.

18. The plasma processing apparatus of claim 16, wherein an upper surface of the projection is lower than an upper surface of the substrate to be processed.

19. The plasma processing apparatus of claim 14, wherein the mask is attachably and detachably provided on the mounting table.

20. The plasma processing apparatus of claim 14, wherein, in the second region, there are provided plural projections for positioning the substrate to be processed at a position of the first region, the projections being spaced apart from each other.

21. The plasma processing apparatus of claim 20, wherein the projections are almost equi-spacedly arranged to surround an outer periphery of the substrate to be processed along a circumferential direction of the mounting table.

22. The plasma processing apparatus of claim 20, wherein an upper surface of the projection is lower than an upper surface of the substrate to be processed.

* * * * *